(12) United States Patent
Brooks et al.

(10) Patent No.: US 10,552,560 B2
(45) Date of Patent: *Feb. 4, 2020

(54) CONTROLLING REAL TIME DURING EMBEDDED SYSTEM DEVELOPMENT

(71) Applicant: Mentor Graphics Corporation, Wilsonville, OR (US)

(72) Inventors: Lance S. P. Brooks, Oregon City, OR (US); Darrell A. Teegarden, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 617 days.

This patent is subject to a terminal disclaimer.

(21) Appl. No.: 15/284,096

(22) Filed: Oct. 3, 2016

(65) Prior Publication Data

US 2017/0185708 A1 Jun. 29, 2017

Related U.S. Application Data

(63) Continuation of application No. 12/218,107, filed on Jul. 10, 2008, now Pat. No. 9,459,890.

(51) Int. Cl.
*G06F 17/50* (2006.01)
*G06F 11/36* (2006.01)
*G06F 9/455* (2018.01)

(52) U.S. Cl.
CPC .......... *G06F 17/5027* (2013.01); *G06F 9/455* (2013.01); *G06F 9/45537* (2013.01);
(Continued)

(58) Field of Classification Search
CPC ............ G06F 17/5027; G06F 9/45537; G06F 11/362; G06F 9/455; G06F 17/5022; G06F 2217/62
(Continued)

(56) References Cited

U.S. PATENT DOCUMENTS 4,868,770 A 9/1989 Smith et al.
5,493,672 A 2/1996 Lau et al.
(Continued)

FOREIGN PATENT DOCUMENTS

WO WO 2010/006245 1/2010

OTHER PUBLICATIONS

Accelerated Technology, "Nucleus Overview," 16 pp. (document marked 2002).
(Continued)

*Primary Examiner* — Dwin M Craig

(57) ABSTRACT

Disclosed herein are representative embodiments of methods, systems, and apparatus that can used to control real-time events (e.g., the real-time clock) during the design, simulation, or verification of an embedded system. In one exemplary embodiment disclosed herein, for example, a real-time clock signal is generated and tasks defined by an embedded software application are triggered with the real-time clock signal. In this embodiment, the embedded software application is executed by an embedded processor with a real-time operating system ("RTOS"), and the real-time clock signal is controllable independent of a processor clock signal driving the embedded processor in a manner that allows the real-time clock to have a different time base than the processor clock.

28 Claims, 12 Drawing Sheets

(52) U.S. Cl.
CPC ........ *G06F 11/362* (2013.01); *G06F 17/5022* (2013.01); *G06F 2217/62* (2013.01)

(58) Field of Classification Search
USPC .............................................. 703/19, 23, 28
See application file for complete search history.

(56) References Cited

U.S. PATENT DOCUMENTS

| | | | |
|---|---|---|---|
| 5,546,562 | A | 8/1996 | Patel |
| 5,551,013 | A | 8/1996 | Beausoleil et al. |
| 5,640,546 | A | 6/1997 | Gopinath et al. |
| 5,663,900 | A | 9/1997 | Bhandari et al. |
| 5,768,567 | A | 6/1998 | Klein et al. |
| 6,085,218 | A | 7/2000 | Carmon |
| 6,810,442 | B1 | 10/2004 | Lin et al. |
| 7,043,718 | B1 | 5/2006 | Au et al. |
| 9,459,890 | B2 * | 10/2016 | Brooks ................. G06F 9/455 |
| 2003/0225565 | A1 | 12/2003 | Garcia et al. |
| 2004/0128006 | A1 | 7/2004 | Jahnicke et al. |
| 2004/0148604 | A1 | 7/2004 | Steffens et al. |
| 2006/0143522 | A1 | 6/2006 | Multhaup et al. |
| 2006/0277546 | A1 | 12/2006 | Rothman et al. |
| 2007/0260447 | A1 | 11/2007 | Canton |
| 2008/0307240 | A1 | 12/2008 | Dahan et al. |

OTHER PUBLICATIONS

Communication pursuant to Article 94(3) EPC dated Jul. 8, 2016, from European Patent Application No. 09790269.6, 5 pp.
Communication pursuant to Article 94(3) EPC dated Jan. 24, 2017, from European Patent Application No. 09790269.6, 5 pp.
Gupta et al., "Synthesis and Simulation of Digital Systems Containing Interacting Hardware and Software Components," IEEE, pp. 225-230 (Jun. 1992).
International Search Report dated Nov. 2, 2009, from International Patent Application No. PCT/US2009/050226 (also published as WO 2010/006245), 4 pp.
Klein, "Miami: A Hardware Software Co-Simulation Environment," IEEE Rapid System Prototyping, pp. 173-177 (May 1996).
Mentor Graphics Corporation, "Accelerated Technology Announces New Prototyping Environment for Embedded Developers Using USB," downloaded from http://www.mentor.com/company/news/at_prototyping_embedded_usb, 2 pp. (document marked Dec. 2004).
Mentor Graphics Corporation, "Seamless Hardware/Software Integration Environment—HW/SW Co-verification and Performance Analysis Datasheet," 4 pp. (document marked 2005).
Minges, "Real-time Software Development in Multi-Processor, Multi-Function Systems," IEEE National Aerospace and Electronics, pp. 675-680 (May 1990).
Nakamura, "Software Verification for System on a Chip using a C/C++ Simulator and FPGA Emulator," *IEEE*, 2006, pp. 1-4.
Notification of First Office Action dated Mar. 29, 2013, from Chinese Patent Application No. 200980132284.7, 44 pp.
Office Action dated Jan. 2, 2014, from Chinese Patent Application No. 200980132284.7, 17 pp.
Office Action dated Oct. 26, 2015, from European Patent Application No. 09790269.6, 5 pp.
The MathWorks, "Real-Time Windows Target 3," 4 pp. (document marked Sep. 2007).
The MathWorks, "xPC Target 2.6—Perform real-time rapid prototyping and hardware-in-the-loop simulation using PC hardware," 6 pp. (document marked Sep. 2004).
The MathWorks, "xPC Target—For Use with Real-Time Hardware—Selecting Hardware Guide Version 1.1," 52 pp. (document marked Feb. 2007).
Verma, "Integrated Real-Time Systems," 40 pp. (Jan. 7, 2007).
Wilson, "Hardware/Software Selected Cycle Solution," IEEE, pp. 190-194 (Sep. 1994).
Wind River, "Wind River Workbench 3.0," 17 pp. (document marked Dec. 2007).
Written Opinion dated Nov. 2, 2009, from International Patent Application No. PCT/US2009/050226 (also published as WO 2010/006245), 8 pp.

* cited by examiner

CONTROLLING REAL TIME DURING EMBEDDED SYSTEM DEVELOPMENT

CROSS REFERENCE TO RELATED APPLICATIONS

This application is a Continuation of U.S. patent application Ser. No. 12/218,107, filed Jul. 10, 2008, entitled, "Controlling real Time During Embedded System Development," now U.S. Pat. No. 9,459,890, which is hereby incorporated by reference.

FIELD

This application relates generally to the field of designing, simulating, and verifying distributed embedded systems.

BACKGROUND

Embedded systems are ubiquitous in modern electronic devices. Embedded systems can be found, for example, in a wide range of consumer products—including televisions, cells phones, media players, and automobiles. In fact, it has been estimated that over 98% of the microprocessors that are produced in a year are used in embedded systems.

In many applications, embedded systems are used to control, monitor, or otherwise regulate one or more subsystems of a larger system. Furthermore, embedded systems are often required to provide reliable and timely behavior. To help ensure that an embedded system reliably meets the timing constraints of a larger system, embedded systems often use real-time operating systems ("RTOSes") that control how tasks are executed by the processor and offer precise timing behavior.

Because embedded systems often interact with a large number of other components and desirably execute real-time software applications, designing embedded systems can be challenging. For example, an embedded software application must not only provide proper functionality, but must also run at a required rate to meet system deadlines and fit into an allotted amount of memory. Furthermore, the embedded system design process often involves numerous development stages, each having a different level of abstraction. For example, an embedded system or an embedded software application may initially be modeled and simulated entirely in a computer environment. All of the surrounding systems may also be modeled and simulated in such an environment. Eventually, as the design process progresses, it may be desirable to debug an embedded software application by running the software on a physical prototype of the embedded system or by running a simulation of the software application while generating and receiving signals to and from the actual hardware components in the overall system. During such simulation and verification, it may be desirable to start, stop, pause, and continue the "real-time" of the software application without disturbing the other operations of the overall system. Such control and flexibility is not possible with conventional development tools. Accordingly, there exists a need for improved methods, systems, and apparatus that provide an embedded system designer greater control, flexibility, and visibility during the development and debugging of real-time embedded software applications.

SUMMARY

Disclosed herein are representative embodiments of methods, systems, and apparatus that can be used to control real-time events (e.g., the real-time clock) during the design, simulation, or verification of an embedded system. The disclosed methods, systems, and apparatus should not be construed as limiting in any way. Instead, the present disclosure is directed toward all novel and nonobvious features and aspects of the various disclosed embodiments, alone and in various combinations and subcombinations with one another. The disclosed methods, systems, and apparatus are not limited to any specific aspect, feature, or combination thereof, nor do the disclosed methods, systems, and apparatus require that any one or more specific advantages be present or problems be solved.

In one exemplary embodiment disclosed herein, a real-time clock signal is generated and tasks defined by an embedded software application are triggered with the real-time clock signal. In this embodiment, the embedded software application is executed by an embedded processor with a real-time operating system ("RTOS"), and the real-time clock signal has a different time base than the processor clock signal driving the embedded processor and is controlled independently (e.g., "time" for the processor progresses independent of "time" for the embedded software application and surrounding environment). The real-time clock signal can be generated, for example, by software running on a computer workstation (e.g., a software application running within a debugger or simulator), software running on another external embedded system, and/or software running as a task within the embedded system. The generation of the real-time clock signal can be suspended for a period of time without interrupting the processor clock signal. Further, the act of suspending the generation of the real-time clock signal can be performed in response to a signal controlled by the embedded software application being executed by the embedded processor. The generation of the real-time clock signal can be restarted without interrupting the processor clock signal, and the act of restarting the simulated real-time clock can also cause the triggering to be continued. The act of restarting the generation of the real-time clock signal can also be performed in response to a signal controlled by the embedded software application being executed by the embedded processor. Furthermore, in some implementations, the embedded processor is a simulated embedded processor and the processor clock signal is a simulated processor clock signal. For instance, the embedded processor and the processor clock signal can be simulated using one of an instruction set simulator or an RTOS simulator (e.g., an implementation of an RTOS that uses PC hardware and PC operating system software to simulate the execution of an embedded application running on an RTOS). In some implementations, execution times of software executed on the embedded processor are measured using a system profiler. In particular implementations, the embedded software application is a first embedded software application, the embedded processor is a first embedded processor, the RTOS is a first RTOS, and the processor clock signal is a first processor clock signal. In these implementations, tasks defined by a second embedded software application can be triggered with the real-time clock signal, the second embedded software application being executed by a second embedded processor with a second RTOS, wherein the real-time clock signal is controllable independent of a second processor clock signal driving the second embedded processor such that the real-time clock has a different time base than the second processor clock.

In another embodiment disclosed herein, an RTOS for a processor of an embedded system is modified so that a source of a real-time clock signal used by the RTOS to trigger execution of a task is decoupled from a source of a processor clock signal that clocks the processor. This decoupling creates two time bases that are independently controllable. For instance, in this embodiment, "time" for the processor progresses independent of "time" for the embedded software application and surrounding environment. The modified RTOS can then be stored on one or more computer-readable media (e.g., in memory of the embedded system and/or in memory of the host computer). In particular implementations, the act of modifying the RTOS comprises altering or adding one or more lines of source code to the source code of the RTOS. Furthermore, the act of modifying can comprise modifying the RTOS so that the pathway on which the real-time clock signal is communicated is one or more of a local area network ("LAN") channel, universal serial bus ("USB") channel, serial peripheral interface ("SPI") channel, joint test action group ("JTAG") channel, FlexRay channel, local interconnect network ("LIN") channel, controller area network ("CAN") channel, or inter-process communication ("IPC") channel of the embedded system. In particular implementations, the RTOS is modified so that the source of the real-time clock signal is, for example, software running on a computer workstation (e.g., a software application running within a debugger or simulator), software running on another external embedded system, and/or software running as a task within the embedded system.

In another exemplary embodiment disclosed herein, a series of real-time event signals are generated and tasks defined by an embedded software application are triggered with the real-time event signals. In this embodiment, the embedded software application is executed by an embedded processor with an RTOS, and the real-time event signals have a different time base than the processor clock signals driving the embedded processor and are independently controllable. For instance, in this embodiment, "time" for the processor progresses independent of "time" for the embedded software application and surrounding environment. The real-time events can be generated, for example, by software running on a computer workstation (e.g., a software application running within a debugger or simulator), software running on another external embedded system, software running as a task within the embedded system running the RTOS receiving the real-time event signal, or a clock generator circuit located on the embedded system. The real-time event signals can indicate, for example, that data is ready to be loaded from or sent to a peripheral coupled to the embedded processor (e.g., a peripheral connected to a sensor or actuator coupled to a plant). The generation of the series of real-time event signals can be suspended for a period of time without interrupting the processor clock signals. Further, the act of suspending the generation of the real-time event signals can be performed in response to a signal controlled by the embedded software application being executed by the embedded processor. The generation of the series of real-time event signals can be restarted without interrupting the processor clock signals, and the act of restarting can cause the triggering to be continued. The act of restarting the real-time event signals can be performed in response to a signal controlled by the embedded software application being executed by the embedded processor. In particular implementations, a real-time clock signal is also generated and at least one other task defined by the embedded software application is triggered with the real-time clock signal. In these implementations, the real-time clock signal is controllable independent of both the processor clock signals and the real-time event signals such that the real-time clock has a different time base than the processor clock signals and the real-time event signals. In other implementations, a real-time clock signal is generated and at least one other task defined by the embedded software application is triggered with the real-time clock signal. In these implementations, the real-time clock signal is controllable independent of the processor clock signals, and the real-time event signals are dependent on the real-time clock. In some implementations, the embedded processor is a simulated embedded processor and the real-time event signal is a simulated real-time event signal. For instance, the embedded processor and the processor clock signals can be simulated using one of an instruction set simulator or an RTOS simulator. The embedded processor can be part of an embedded system, and the real-time event signal can be generated by a circuit located on the embedded system. In some implementations, execution times of interrupt service routines executed on the embedded processor are measured using a system profiler. Further, in some implementations, the embedded software application is a first embedded software application, the embedded processor is a first embedded processor, the RTOS is a first RTOS, and the processor clock signals are first processor clock signals. In these implementations, tasks defined by a second embedded software application can be triggered with the real-time event signals, wherein the second embedded software application is executed by a second embedded processor with a second RTOS, and wherein the real-time event signals are controllable independent of second processor clock signals that drive the second embedded processor such that the real-time event signal has a different time base than the second processor clock signal.

In another exemplary embodiment disclosed herein, a real-time operating system ("RTOS") of a processor in an embedded system is modified so that a source of a real-time event signal used to trigger execution of a task is decoupled from a source of a processor clock signal that clocks the processor. This decoupling creates two independent time bases that are independently controllable. For instance, in this embodiment, "time" for the processor progresses independent of "time" for the embedded software application and surrounding environment. The modified RTOS can then be stored on one or more computer-readable media (e.g., in memory of the embedded system or in memory of the host computer). The act of modifying can comprise altering or adding one or more lines of source code to the source code of the RTOS. Further, the act of modifying can comprise modifying the RTOS so that the pathway on which the real-time event signal is communicated is one or more of a local area network ("LAN") channel, universal serial bus ("USB") channel, serial peripheral interface ("SPI") channel, or joint test action group ("JTAG") channel, FlexRay channel, local interconnect network ("LIN") channel, controller area network ("CAN") channel, or inter-process communication ("IPC") channel of the embedded system. In particular implementations, the method further comprises modifying the RTOS so that a real-time clock signal used by the RTOS is also decoupled from the source of the processor clock signal that clocks the processor. In particular implementations, the RTOS is modified so that the source of the real-time event signal is, for example, software running on a computer workstation (e.g., a software application running within a debugger or simulator), software running on another external embedded system, software running as a task within the embedded system, or a clock generator circuit located on the embedded system.

Another disclosed embodiment is a system comprising a host computer configured to execute software that generates a first signal, and an embedded system coupled to the host computer and having an embedded processor. In this embodiment, the embedded processor is configured to run an RTOS that executes tasks of a software application based on receipt of the first signal from the software running on the host computer and is further configured to execute individual instructions of the tasks based on receipt of a second signal. In this embodiment, the first signal is controllable independent of the second signal such that the first and second signals have different time bases. The first signal can be the real-time clock signal or a real-time event signal that is not the real-time clock signal. Further, the first signal can be communicated through one of a local area network ("LAN") channel, universal serial bus ("USB") channel, serial peripheral interface ("SPI") channel, joint test action group ("JTAG") channel, FlexRay channel, local interconnect network ("LIN") channel, controller area network ("CAN") channel, or inter-process communication ("IPC") channel of the embedded system. The software executing on the host computer can be capable of suspending the first signal while the second signal continues uninterrupted. The system may also comprise one or more additional embedded systems coupled to the host computer, each having respective embedded processors running respective RTOSes that are configured to execute tasks of respective software applications based on receipt of the first signal from the software running on the host computer, and each being configured to execute individual instructions of the tasks based on receipt of other respective signals that are controllable independent of the first signal. The host computer can be further configured to execute a simulator or debugger. The software that generates the first signal can be running within the simulator or debugger.

Any of the disclosed methods may be performed at least in part by a computer program, such as an electronic-design-automation ("EDA") software tool, comprising computer-executable instructions stored on one or more computer-readable media. Furthermore, any of the operating systems that may be modified according to embodiments of the disclosed methods (e.g., modified RTOSes) can also be stored on one or more computer-readable media.

The foregoing and other objects, features, and advantages of the disclosed technology will become more apparent from the following detailed description, which proceeds with reference to the accompanying figures.

BRIEF DESCRIPTION OF THE DRAWINGS

In FIG. 14, the processor clock is used as the basis for the time axis.

In FIG. 15, the real-time clock is used as the basis for the time axis.

DETAILED DESCRIPTION

I. General Considerations

Figure 1:
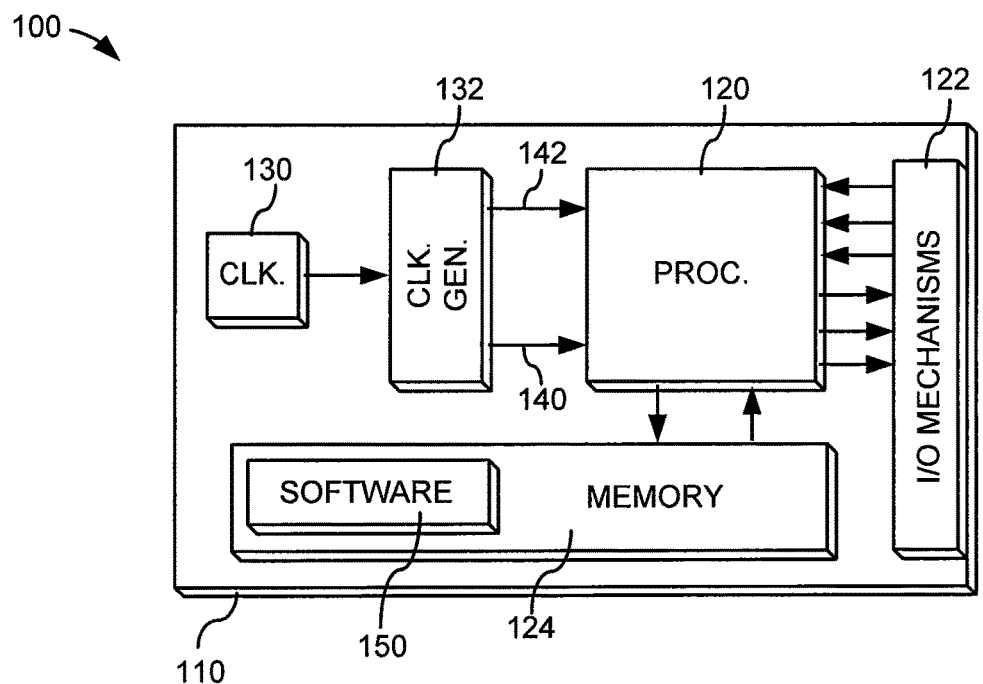
FIG. 1 is a schematic block diagram illustrating an exemplary embedded system that can be designed, simulated, or verified using embodiments of the disclosed technology.

Disclosed below are representative embodiments of methods, apparatus, and systems that can be used in connection with designing, simulating, or verifying embedded systems.

The disclosed methods, systems, and apparatus should not be construed as limiting in any way. Instead, the present disclosure is directed toward all novel and nonobvious features and aspects of the various disclosed embodiments, alone and in various combinations and subcombinations with one another. The methods, systems, and apparatus are not limited to any specific aspect or feature or combination thereof, nor do the disclosed methods, systems, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "triggering" and "generating" to describe the disclosed methods. These terms are high-level abstractions of the actual operations that are performed. The actual operations that correspond to these terms may vary depending on the particular implementation and are readily discernible by one of ordinary skill in the art.

The disclosed technology can be applied during the design, simulation, and/or verification of one or more embedded systems. The embedded systems are typically part of a distributed system comprising multiple embedded systems in communication with one another. The embedded systems can be implemented using a variety of different hardware technologies, including integrated circuits (e.g., application-specific integrated circuits ("ASICs"), programmable logic devices ("PLDs"), systems-on-a-chip ("SoCs" or microprocessors) or printed circuit boards ("PCBs"), which may themselves comprise one or more of integrated circuits and other digital and/or analog components). Further, the embedded systems are typically implemented using a variety of software technologies that drive or otherwise control the hardware. The one or more embedded systems can be used in a vast assortment of electronic devices, ranging from portable electronics (e.g., cell phones, media players, and the like) to larger-scale items (e.g., computers, control systems, airplanes, automobiles, factories, and the like). All such items comprising one or more embedded systems designed, simulated, and/or verified at least in part using embodiments of the disclosed technology are considered to be within the scope of this disclosure.

Any of the disclosed methods can be performed using software stored on one or more computer-readable media (e.g., tangible computer-readable media, such as one or more optical media (e.g., CDs or DVDs), volatile memory components (such as DRAM or SRAM), or nonvolatile memory components (such as hard drives)), storing computer-executable instructions that when executed by a computer (e.g., any commercially available computer) cause the computer to perform any of the disclosed methods). Such software can comprise, for example, an electronic-design-automation ("EDA") software tool used to provide an interactive design space in which any hardware or software component of an embedded system or distributed embedded system (comprising two or more embedded systems) can be designed, simulated, and/or verified. One exemplary software tool is the SystemVision tool available from Mentor Graphics Corporation.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, computer, or network architecture. For this same reason, computer hardware that can be used to execute the computer-readable instructions is not described in further detail.

Further, design information for one or more embedded systems, modified software for execution in one or more embedded systems (e.g., a modified real-time operation system or embedded software application), or simulation results from simulating one or more embedded systems (including any intermediate or partial results) produced from any of the disclosed methods can be created, updated, or stored on computer-readable media (e.g., one or more tangible computer-readable media, such as optical media (e.g., CDs or DVDs), volatile memory components (such as DRAM or SRAM), or nonvolatile memory components (such as hard drives)) using a variety of different data structures or formats. Such design information, modified software, and/or simulation results can be created or updated at a local computer or over a network (e.g., by a server computer).

Computer-executable instructions for implementing any of the disclosed methods, design information produced while using any of the disclosed methods, modified software generated by the disclosed methods, and/or simulation results produced while using any of the disclosed methods can be transmitted or accessed through a variety of tangible communication media, including the Internet, intranet, World Wide Web, software applications, telephone, television, cable, video, radio, magnetic communications, electronic communications, or other communications means. For example, computer-executable instructions for causing a computer to perform any of the disclosed methods can be transmitted from a server computer to a client computer through any such tangible communication media and stored in tangible computer-readable media at the client computer.

Any of the disclosed methods can also be used in a computer simulation environment, where the embedded systems are simulated or otherwise analyzed using representations (or models) of the embedded systems that are stored on one or more computer-readable media. For presentation purposes, however, the present disclosure sometimes refers to the embedded system or its components by their physical counterparts (e.g., a processor, bus, interface, and other such terms). It should be understood, however, that any reference in the disclosure or the claims to a physical component includes not only the physical components but also representations (or models) of such components as are used in simulation, design, or other such EDA environments.

II. Embedded Systems, Generally

FIG. 1 is a schematic block diagram of a typical embedded system 100. The illustrated embedded system 100 comprises several hardware components on a printed circuit board ("PCB") 110. It should be noted that the PCB 110 is just one of several physical packaging possibilities for embedded systems hardware. Other packaging options include integrated circuits (e.g., ASICs, PLDs, or SoCs). Further, multiple embedded systems can be included with the same physical packages (e.g., multi-core ASICs or multi-processor PCBs). All such packaging possibilities are considered to be within the scope of this disclosure and usable with the disclosed technology. For ease of illustration, however, the figures and following discussion refer to a PCB. In FIG. 1, the boundary of an isolated embedded system is shown conceptually as the PCB 110, though this implementation should not be construed as limiting. Further, the number and type of components illustrated in the embedded system 100 will vary from implementation to implementation and should not be construed as limiting. The embedded system 100 comprises a processor 120 (e.g., a microprocessor or microcontroller). The processor 120 can be any suitable processor but typically operates using software 150, which comprises a real-time operating system ("RTOS") software component and one or more application software components. The RTOS software component typically controls and schedules how the application software components ("tasks") are executed by the processor.

In general, an RTOS provides "deterministic" timing behavior. In other words, the operating system services that are offered by the RTOS consume only known and expected amounts of time, thus allowing the operating systems to run applications that are used in a real-time environment where timely completion of a particular task may be important to the proper operation of the overall system. For this reason, processors using RTOSes are often used in embedded applications that are found within complex electronic devices. It should be noted that the disclosed technology is generally applicable to operating systems or schedulers that provide deterministic timing behavior, all of which are considered to be encompassed by the term RTOS as used herein.

The processor 120 of FIG. 1 is coupled to one or more input/output ("I/O") mechanisms 122 that facilitate communication of the embedded system 100 with external systems or components. The I/O mechanisms 122 can comprise one or more communication channels known in the art. For example, the I/O mechanisms 122 can comprise one or more of a local area network ("LAN") channel, universal serial bus ("USB") channel, serial peripheral interface ("SPI") channel, joint test action group ("JTAG") channel, FlexRay channel, local interconnect network ("LIN"), controller area network ("CAN") channel, inter-process communication ("IPC") channel, or any combination or subcombination thereof. This list should not be construed as limiting, as the I/O mechanisms may comprise other analog or digital communication channels (including, for example, any Analog-to-Digital (A/D) or Digital-to-Analog (D/A) converter).

The illustrated embedded system 100 further includes a memory 124 coupled to the processor 120 and used to store software 150 and information generated during operation of the embedded system or to provide information to the processor. For example, the memory 124 may store the machine code for the RTOS software component and the one or more embedded application software components (tasks) to be executed by the processor during operation of the embedded system 100. The memory 124 can comprise any one or more of a variety of nonvolatile memory components (e.g., EEPROMs, hard drives, miniature magnetic disks, Flash memory, nonvolatile RAM, or the like) or volatile memory components (e.g., DRAM, SRAM, or the like).

The illustrated embedded system 100 further comprises a clock source 130 and a clock generating circuit 132. The clock source 130 can comprise, for example, a crystal oscillator (e.g., a quartz oscillator) or other source of a stable, periodic signal. The clock generating circuit 132 typically comprises combinational and/or sequential logic configured to receive the clock signal from the clock source 130 and to provide one or more other clock signals derived from the original clock signal. For instance, the clock generating circuit 132 may comprise clock dividing or clock multiplying logic that produces clock signals of varying frequencies.

In the illustrated embodiment, for example, the clock generating circuit 132 generates two clock signals for the processor 120: a processor clock 140 and a real-time clock 142. Both the processor clock 140 and the real-time clock 142 are derived from the original clock signal from the clock source 130. Because the real-time clock 142 is derived from the same source as the processor clock 140, the two clocks are said to be coupled and share the same time base. It should be noted that the arrangement of the clock circuits 130 and 132 is just one of several means to generate two clocks that share the same time base and should not be construed as limiting. For example, each of the clocks 140 and 142 may be derived from separate clock sources and clock generator circuits (e.g., two independent quartz oscillators). However, since the two clock sources ultimately rely on real-world physics to oscillate, they share the same time base and are thus considered to be coupled to each other.

The processor clock 140 controls the basic rate at which individual instructions are executed by the processor 120. By contrast, the real-time clock 142 controls the rate at which tasks (e.g., sets of instructions) can be called, executed, and preempted by the processor 120. The real-time clock 142 is typically slower than the processor clock 140 and is used in conjunction with the operating system (e.g., the RTOS) running on the processor 120.

Figure 2:
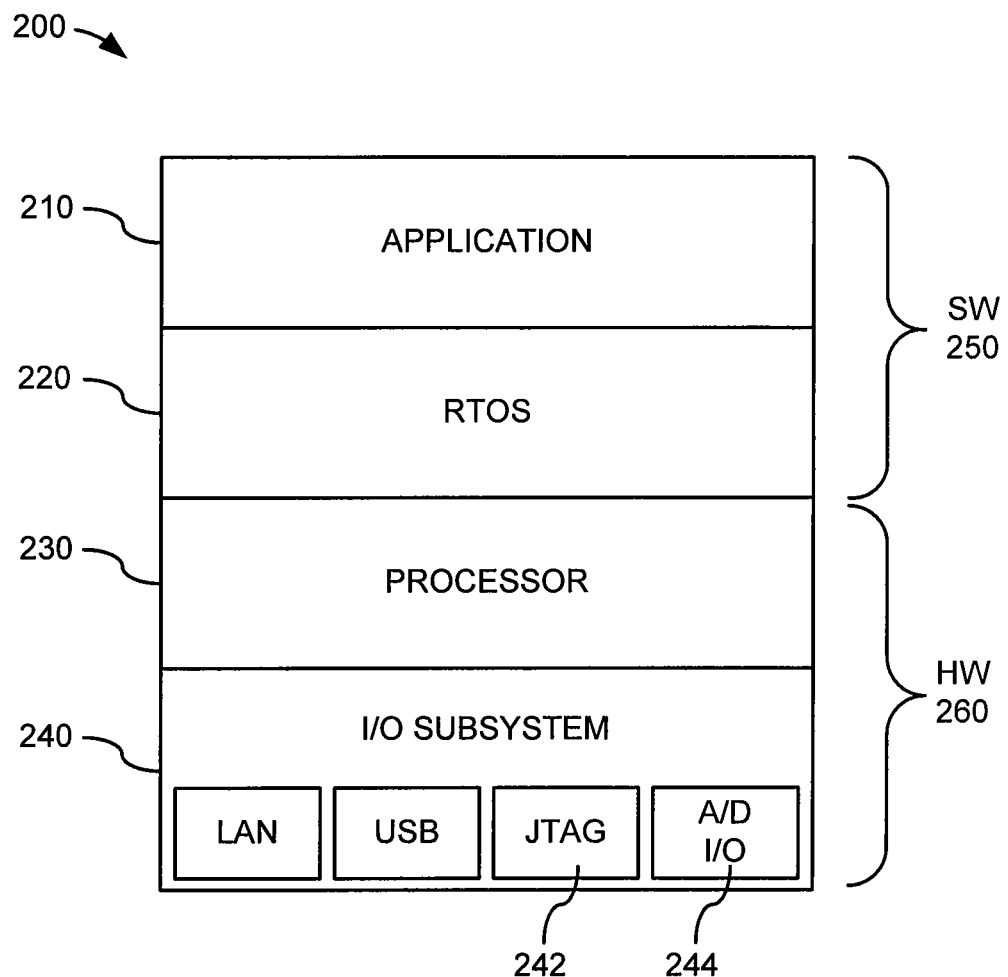
FIG. 2 is a schematic block diagram illustrating the various layers of abstraction that are involved with the embedded system shown in FIG. 1.

FIG. 2 is a schematic block diagram 200 illustrating the various layers of abstraction that are involved with the embedded system 100. Application layer 210 represents the application portion of the software 150 that is embedded in the system 100 and provides the desired behavior of the system. The application layer 210 is the layer that is "visible" to the other components and systems interacting with the embedded system and inputs and outputs information in response to the real-time clock signal and, in some cases, to other real-time events. RTOS layer 220 represents the RTOS portion of the software 150 running on the processor. The RTOS layer 220 provides the deterministic behavior of the system and executes the application layer 210.

Together, the application layer 210 and the RTOS layer 220 represent the software 250 of the embedded system. The software 250 of the embedded system represents the software 150 running on the processor. Because the operations performed by the software application are essentially logic operations that generate predictable outputs and control the logical behavior of the embedded system as a whole, the application layer and RTOS layer can be referred to as operating in the "application time domain" or "logic plane." The rate at which the application time domain advances is defined by the real-time clock and/or by one or more real-time events (which can be synchronous or asynchronous to the real-time clock).

Processor layer 230 of FIG. 2 represents the processor on which the software 250 operates. I/O subsystem layer 240 represents the various other hardware components of the embedded system that are coupled to or otherwise support the operation of the processor and the software 250 it executes. Further, some components within the I/O subsystem layer 240 support the processor (e.g., JTAG 242) and other components support the application (e.g., analog and digital I/O 244).

Together, processor layer 230 and I/O subsystem layer 240 represent the hardware 260 of the embedded system. Because the operations performed by the processor and the other hardware of the embedded system are invisible to the components interacting with the embedded system and are not directly defined by the application, the operations performed by the processor and the other hardware of the embedded system can be viewed as operating in a different time domain or plane. In particular, because the processor's operations are controlled by the physical clock source on the embedded system, the processor layer 230 can be referred to as operating in the "physical time domain" or "physical plane." Conceptually, then, the "logic plane" relates to the logic operations performed by the embedded software application, whereas the "physical plane" relates to the underlying systems that execute the embedded software or that otherwise physically exist within the embedded system and do not control the logical behavior of the embedded system.

Figure 3:
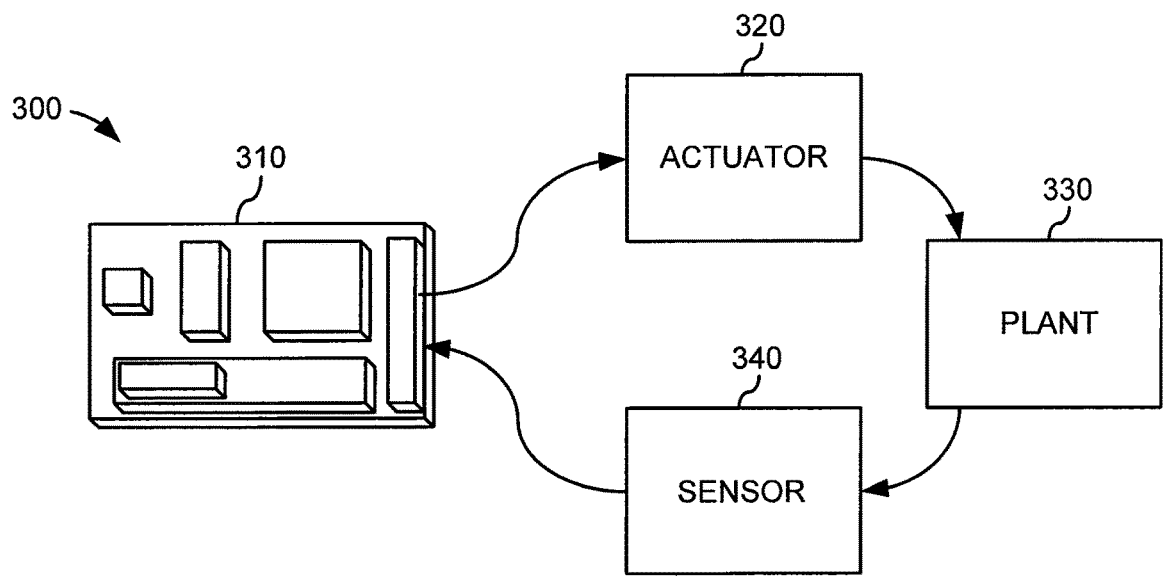
FIG. 3 is a schematic block diagram illustrating a typical control system that the embedded system shown in FIG. 1 might operate.

FIG. 3 is a schematic block diagram illustrating a typical control system 300 in which the embedded system 100 of FIG. 1 might operate. In relevant part, FIG. 3 shows an embedded system 310, an actuator 320, a plant 330, and a sensor 340. In the illustrated embodiment, the actuator 320 is coupled to the embedded system 310 and receives control signals from the embedded system 310 that affect the state of the actuator. The actuator 320 is coupled in turn to the plant 330 and is configured to alter some performance or operating characteristic of the plant depending on the state of the actuator. The sensor 340 is coupled to the plant 330 and is configured to obtain a measurement related to the performance or operating characteristic of the plant altered by the actuator 320. The sensor 340 is also coupled to the embedded system 310 and provides the embedded system with a sensor signal indicative of the value of the measurement. In this fashion, the control system 300 forms a closed-loop control system.

Such closed-loop control systems are used in a wide variety of applications, all of which can be designed, simulated, or verified using embodiments of the disclosed technology. For example, such closed-loop control systems describe the mechatronic systems found throughout modern automobiles and other vehicles. By way of example, the control system 300 might comprise the electronic throttle control of an automobile, in which case the plant 330 would be an electronic throttle body, the actuator 320 would be the throttle plate rotator (e.g., an electric motor) that operates to move the throttle plate of the throttle body in response to control signals from the embedded system 310, and the sensor 340 would be the throttle plate position sensor (e.g., a potentiometer) that operates to detect and measure the position of the throttle plate.

Furthermore, although a single closed-loop system is shown in FIG. 3, a single embedded system might interact with one or more additional actuators or sensors coupled to respective additional plants, thereby forming multiple additional closed-loop systems. Similarly, the embedded system might be part of a larger distributed embedded system (comprising two or more embedded systems connected by a communication network or channel), each controlling any number of actuators and receiving signals from any number of sensors.

III. Exemplary Design, Simulation, and Verification Environments

During the process of designing, simulating, or verifying an embedded system (e.g., an embedded system used in a distributed embedded system), it is often desirable to simulate one, some, or all of the components of the embedded system (including the software to be executed on the embedded system) or one, some, or all of the components to which the embedded system is intended to be coupled (e.g., actuators, plants, sensors, and other such components).

Figure 4:
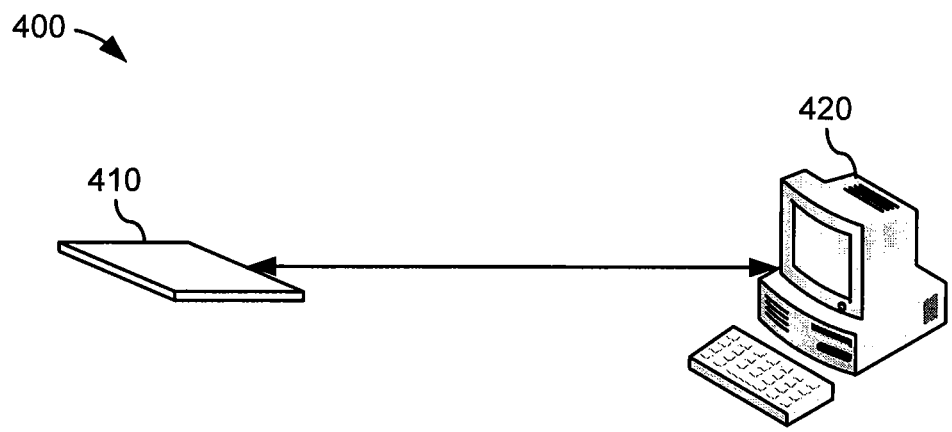
FIG. 4 is a schematic block diagram illustrating a first arrangement for designing, simulating, or verifying the software and/or hardware of an embedded system using embodiments of the disclosed technology.
Figure 5:
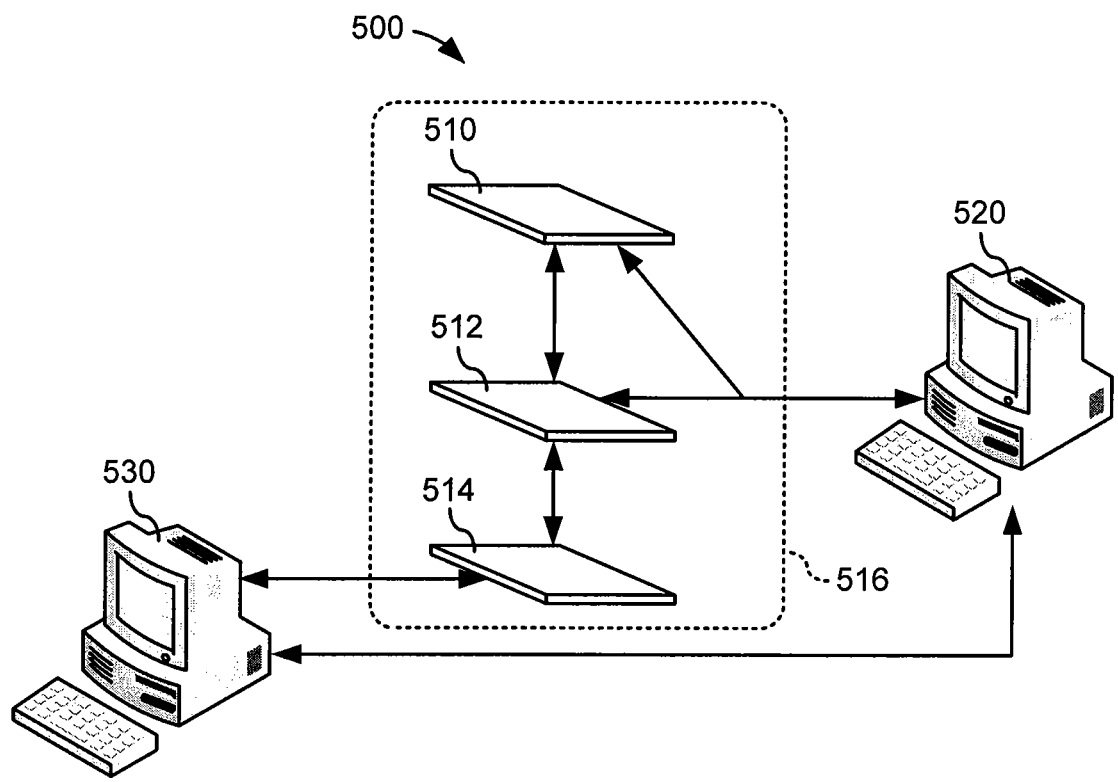
FIG. 5 is a schematic block diagram illustrating a second arrangement for designing, simulating, or verifying the software and/or hardware of an embedded system using embodiments of the disclosed technology.

Exemplary environments as may be used to design, simulate, or verify any of the components in an embedded system or distributed embedded system using embodiments of the disclosed technology are illustrated in FIGS. 4 and 5. In particular, FIG. 4 is a schematic block diagram 400 showing an embedded system 410 coupled to a workstation 420. FIG. 5 is a schematic block diagram 500 showing embedded systems 510, 512, 514, which together form an exemplary distributed embedded system 516, coupled to workstations 520, 530. Although three embedded systems and two workstations are shown in FIG. 5, any number of embedded systems can be included in the distributed embedded system 516 and any number of workstations can be used within the environment. The workstations 420, 520, 530 are typically coupled to the embedded systems through a suitable communication bus or other interface providing communications to the embedded systems.

The workstations can be used, for instance, to design, simulate, or verify any of the sensors, actuators, plants, or other embedded systems with which the embedded systems 410, 510, 512, 514 are intended to communicate. The designer may also use a software tool on the workstations 420, 520, 530 to design and simulate the embedded software application that will be executed on an embedded system. In other words, the exemplary simulation environments shown in FIGS. 4 and 5 can be used as part of a design, simulation, or verification process for both hardware and software. For instance, the workstations 420, 520, 530 can provide a debugging environment that allows a user to debug software as it is being executed by the processor. The workstations 420, 520, 530 can also provide a simulation environment that allows a user to simulate execution of an application in an embedded system (e.g., using an instruction set simulator, RTOS simulator, or other suitable simulator), thereby producing appropriate signals to the embedded systems that can help verify the intended operation of the software. Further, the workstations 420, 520, 530 may provide a simulation environment in which hardware components interacting with the embedded systems (e.g., actuators, plants, and sensors) are simulated. An example of a software tool that can provide a simulation environment as described above is the SystemVision system modeling software tool that is commercially available from Mentor Graphics Corporation.

Furthermore, although only a single workstation is shown in FIG. 4, it should be understood that the simulation environment to which the embedded systems are coupled can be implemented by two or more workstations, each running two or more software tools, or can involve multiple simulation environments (implemented by one, two, or more workstations) coupled to the embedded systems through additional I/O mechanisms. Additionally, it should be understood that the entire system (comprising one or more embedded systems) can be simulated such that no physical embedded systems are used during the design, simulation, or verification process.

Any of the above-referenced environments can be used in connection with performing embodiments of the disclosed technology.

IV. Controlling Real-Time Events

During the design, simulation, and/or verification phase of developing distributed embedded systems, it is often desirable to model one or more components of the distributed embedded system (either the hardware or the software) and to simulate operation of that component in a controlled environment. For example, it is often desirable to analyze or debug the embedded software for an embedded system as the embedded software is being executed by the processor of the embedded system and interacting with other systems and/or components of the distributed system. However, because the real-time clock and the processor clock of an embedded system are typically coupled and share the same time base, software debugging or simulation of the embedded software can be problematic. For instance, the software debugger or simulator operating on the workstation may not be able to keep pace with the real-time clock as derived from the source clock on the embedded system. Or, in certain cases, it may be desirable to simulate real-time events within software running on the workstation at a rate much faster than that provided by the source clock. Because of the interdependency and shared time bases between the real-time clock and the processor clock, however, such controlled simulation is not ordinarily possible.

Still further, when the system being designed or verified is coupled to other embedded systems, actuators, plants, and/or sensors, it is ordinarily not possible to start, stop, or otherwise control the clocks or timing events in the physical time domain of the other components. For example, if a designer is verifying software in an embedded system for controlling a motor using a prototype of the embedded system coupled to a workstation and to a physical motor, it is not possible for the software running on the workstation to quickly "stop" the underlying physical time domain in which the motor is operating (e.g., it is not possible for the software running on the workstation to instantly stop and start the armature of the physical motor that is rotating within a magnetic field nor is it possible to instantly stop and start the plant connected to its shaft).

To help address these issues, embodiments of the disclosed technology separate (or decouple) the real-time clock from the processor clock in embedded systems that are being designed, simulated, or verified. Embodiments of the disclosed technology allow the application time domain to be controlled independently of the physical time domain for the embedded system being designed, simulated, or verified (the two time domains may thus have a different and independent time base, each of which can be controlled separately). For instance, in certain embodiments, the real-time clock controlling an embedded application is generated by software running on a workstation, not a clock source on the embedded system. The processor clock can therefore remain undisturbed and continue to be derived from the clock source. This separation makes it possible to start, stop, pause, and continue "real time" for embedded applications without altering the underlying execution of the system.

Figure 6:
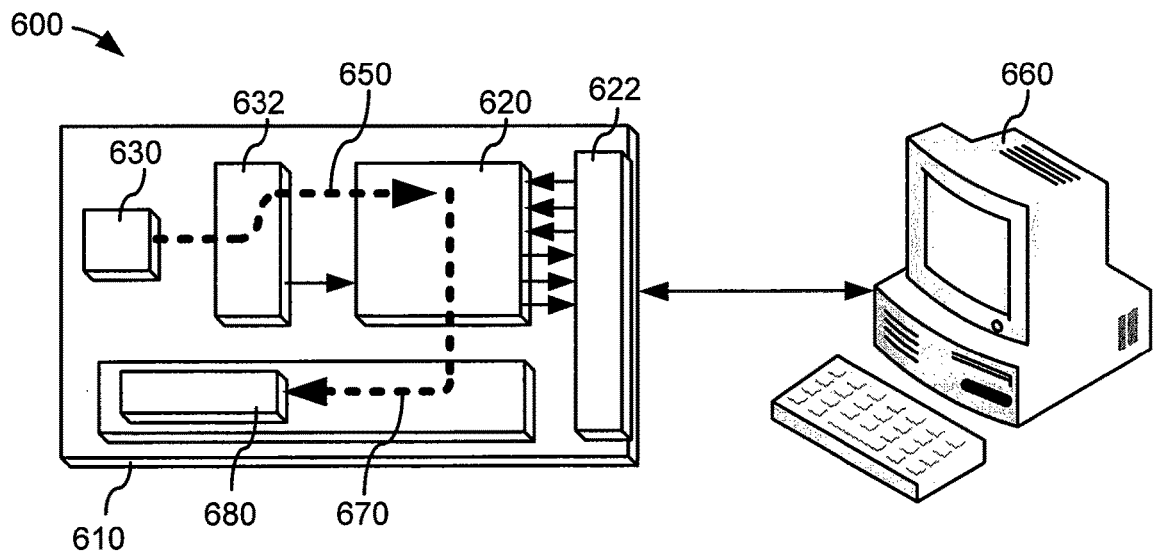
FIG. 6 is a schematic block diagram illustrating an exemplary design, simulation, or verification environment in which the real-time clock of an embedded system is generated by a clock source on the embedded system.

FIG. 6 is a schematic block diagram 600 showing an exemplary design, simulation, or verification environment in which a workstation 660 is coupled to an embedded system 610 and in which the real-time clock is derived from a clock source on the embedded system. In particular, the embedded system 610 includes a clock source 630 that generates an original clock signal that is received by clock generating circuit 632. The clock generating circuit 632 generates two clock signals from the original clock signal: a real-time clock signal and a processor clock signal. Both the real-time clock signal and the processor clock are coupled to embedded processor 620. For purposes of illustration, the path of the real-time clock from its original source is shown as dashed line 650 in FIG. 6. For the purpose of further illustration, the signal along path 650 is shown to trigger, typically through the interrupt subsystem of the processor 620, another signal along path 670 that continues from the hardware and into the interrupt subsystem of the RTOS software 680. The RTOS of the embedded processor 620 uses the real-time clock signal to control the execution of tasks defined by the embedded software application that the embedded processor is executing. The processor 620 uses the processor clock to control the rate at which the instructions associated with each real-time event are executed.

Figure 7:
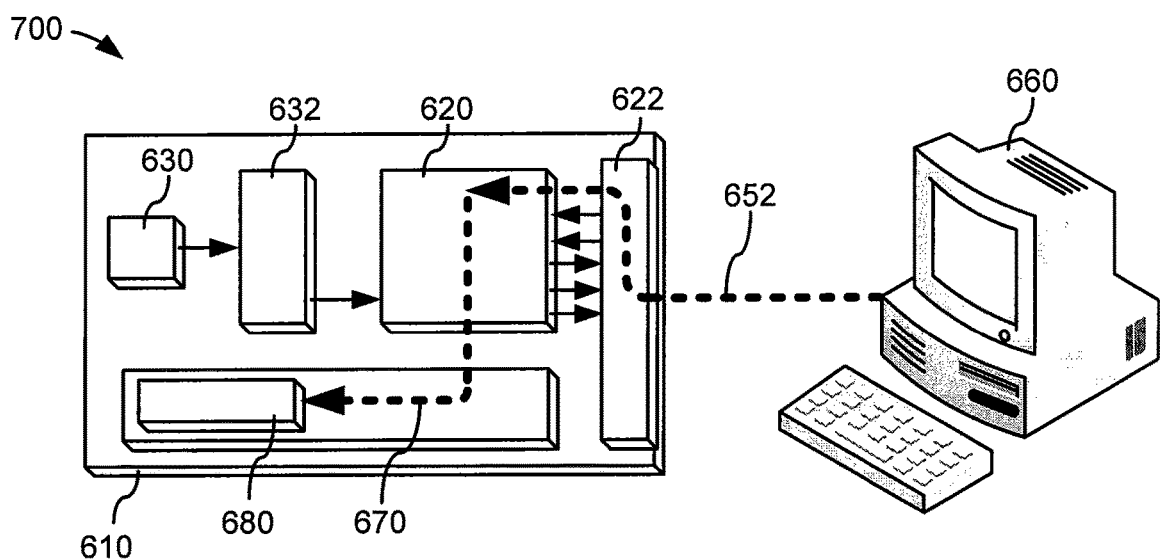
FIG. 7 is a schematic block diagram illustrating an exemplary design, simulation, or verification environment in which the real-time clock of an embedded system is generated by software running on a host workstation while the processor clock continues to be generated by a clock source on the embedded system.

FIG. 7 is a schematic block diagram 700 showing the exemplary design, simulation, or verification environment of FIG. 6 in which the real-time clock is independent of (or decoupled from) the processor clock and thus may have a different time base. The real-time clock signal path is illustrated in FIG. 7 by dashed line 652. In the illustrated embodiment, the real-time clock is generated by software running on the workstation 660. In particular, the real-time clock signal in FIG. 7 is generated by software running on the workstation 660, such as a software debugger or simulation tool. The "simulated" real-time clock signal is coupled to the embedded system 610 through one of the I/O mechanisms that provides a communication channel between the workstation 660 and the processor 620. The real-time clock signal can be propagated through any suitable I/O mechanism 622 of the embedded system capable of coupling the workstation 660 to the interrupt subsystem of the processor 620. For example, the real-time clock signal can be routed on a LAN channel, USB channel, SPI channel, JTAG channel, FlexRay channel, LIN channel, CAN channel, IPC channel, or any combination or subcombination thereof. Similar to how the signal along path 650 in FIG. 6 is shown to trigger another signal along path 670, the signal along the path 652 in FIG. 7 is shown to trigger, typically through the interrupt subsystem of the processor 620, another signal along path 670 that continues from the hardware and into the interrupt subsystem of the RTOS software 680.

In order for the RTOS to properly receive the real-time clock signal along the communication channel coupled to the workstation, modifications to the RTOS and/or other embedded software are typically performed. For example, the component of the RTOS that handles the basic timing services for the RTOS can be modified such that the channel on which the real-time clock is expected is altered to one of the above alternative channels. With some RTOSes, this modification can be performed by modifying a configuration file, parameter, or through some other configuration procedure provided for by the RTOS manufacturer (e.g., as part of a build/configuration step of the RTOS or during a run-time configuration step of the RTOS). With certain RTOSes, however, the source code of the RTOS itself may need to be modified. In some cases, other embedded components may alternatively or additionally need to be modified so that the RTOS will expect the real-time clock through the desired I/O mechanism coupled to the workstation 660. For example, in some cases, peripheral driver software is also or alternatively modified.

Figure 8:
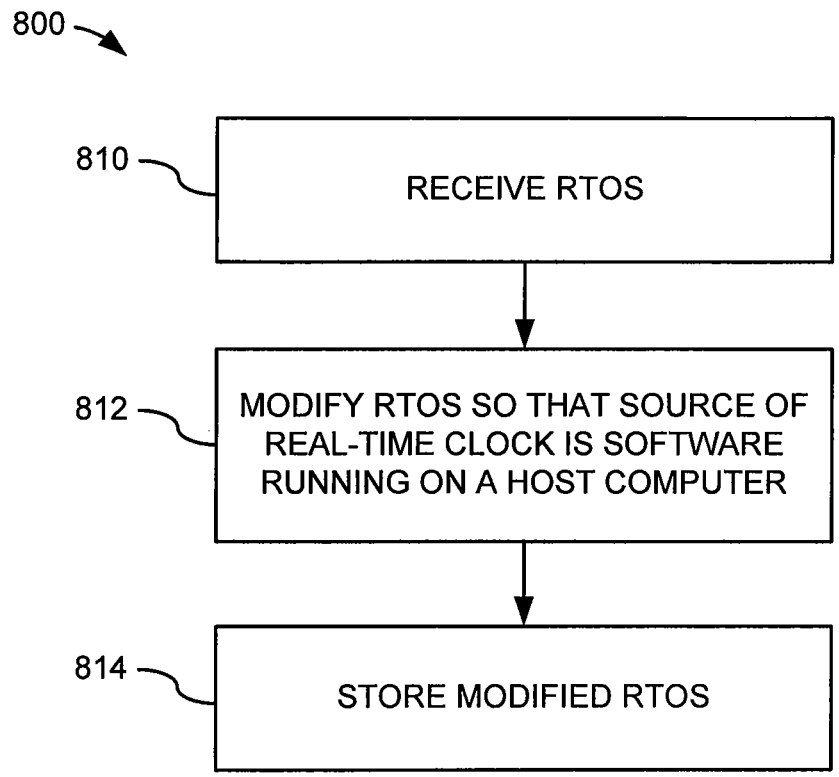
FIG. 8 is a flowchart illustrating an exemplary method for modifying a real-time operating system ("RTOS") of an embedded system so that the source of the real-time clock is software running on a host workstation.

FIG. 8 is a flowchart illustrating one exemplary embodiment 800 for modifying an RTOS according to the disclosed technology. At 810, at least a portion of an RTOS for a processor of an embedded system is received (e.g., the portion of the RTOS handling timing services or timer assignments). At 812, the RTOS is modified so that the pathway on which the real-time clock is communicated is a communication channel of the embedded system that is to be coupled to a host computer (e.g., a LAN channel, USB channel, SPI channel, JTAG channel, FlexRay channel, LIN channel, CAN channel, IPC channel, or any combination or subcombination thereof). Consequently, the source of the real-time clock signal is decoupled from the source of the processor clock signal (the ultimate "time bases" or "time planes" of the signals are consequently decoupled and thus separately controllable). At 814, the modified RTOS is stored (e.g., on one or more tangible computer-readable media of the host workstation or in memory of the embedded system for execution).

Figure 19:
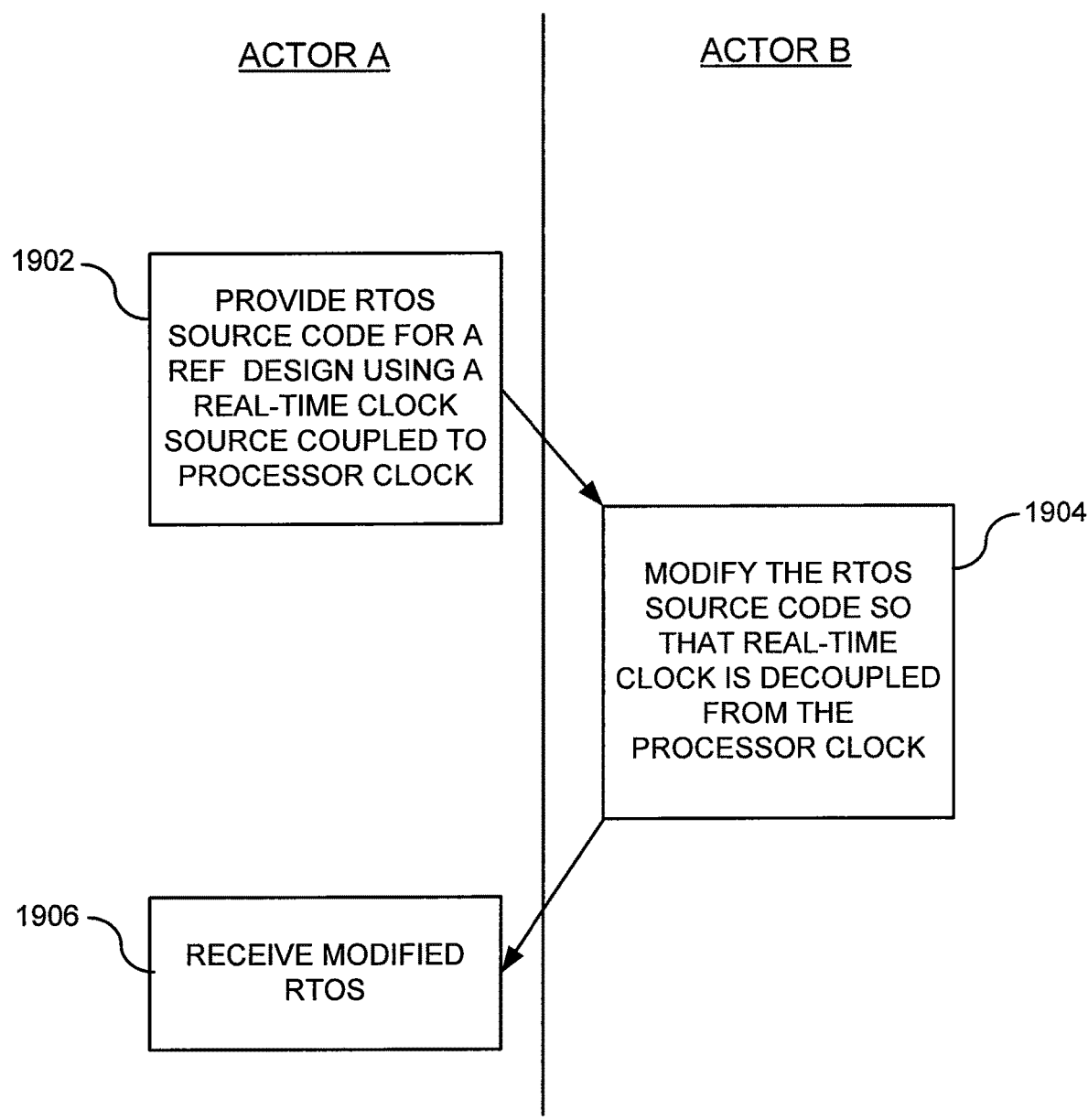
FIG. 19 is a flow chart illustrating one exemplary method of modifying RTOS source code according to embodiments of the disclosed technology.

FIG. 19 is a flowchart illustrating another exemplary method for modifying an RTOS to use an alternative source for the real-time clock signal. Although the figure illustrates the process of modifying the RTOS to use an alternative source for the real-time clock signal, the same process can be effectively used to modify the RTOS to use alternative sources for real-time events. At process block 1902, for example, actor A provides the RTOS reference design to actor B for modification. In process block 1904, actor B modifies the RTOS source to use the alternative channel for the real-time clock signal as described in the disclosed embodiments. At process block 1906, actor A receives the modified RTOS from actor B. Any embedded software application that is dependent on the RTOS can then be executed on the modified RTOS. The method shown in FIG. 19 is an example only and is not the only method for modifying an RTOS according to embodiments of the disclosed technology.

Figure 9:
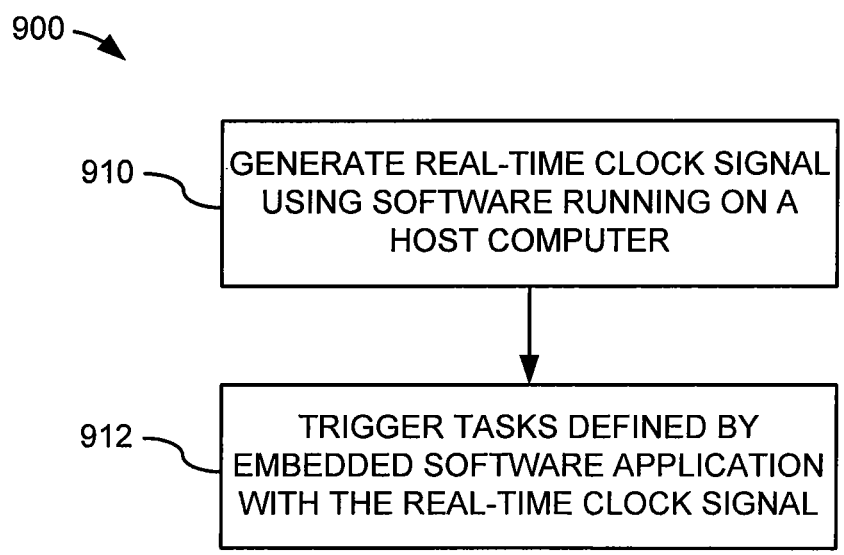
FIG. 9 is a flowchart illustrating an exemplary method of operating a design, simulation, or verification environment in which the real-time clock of an embedded system is generated by software running on a host workstation.

FIG. 9 is a flowchart illustrating an exemplary method 900 for controlling real-time clocks (e.g., in any of the design, simulation, or verification environments described above). At 910, a real-time clock signal is generated by software running on the host computer. At 912, one or more tasks defined by the software application being executed by the RTOS running on an embedded processor of an embedded system are triggered by the real-time clock signal. The RTOS can be a modified RTOS configured to receive the real-time clock signal through a communication channel coupled to the host computer. For example, the RTOS can be modified by the method 800 of FIG. 8. Because the real-time clock is independent of the processor clock and clock source of the embedded system, the software running on the host computer can control the embedded software of the embedded system in a time-synchronized fashion, at a different time base relative to the processor clock, without interrupting the processor clock. For instance, the processor clock may continue to operate at full speed (sometimes referred to as "at speed") during method acts 910, 912.

In certain implementations of the method 900, the software running on the host computer generates the real-time clock signals in a "non-block mode." For instance, the software running on the host computer can continue to generate clock signals at the desired rate without waiting for the processor or other component of the receiving system to acknowledge receipt of the real-time clock signal. The non-blocking mode is desirably used when the receiver of the real-time clock signals (e.g., the processor and RTOS) is able to process the real-time events as fast as they are supplied. Alternatively, the software running on the host computer can operate in a "blocking mode" in which the software running on the host computer waits for the processor, RTOS, or other component of the receiving system to acknowledge receipt of the real-time clock signal before generating the next signal. This provides the opportunity for any of the systems that might be receiving the real-time clock signal to control the progression of time in the real-time clock domain ("application time domain" or "logic plane"). For instance, the embedded software application being executed by the embedded processor can control the progression of real time by not providing an acknowledgement signal until the embedded software application is ready to proceed. This mode can be useful, for instance, when the embedded software that is running on the embedded system is under the control of a debugger and has suspended. Another situation in which the blocking mode can be useful is when the receiving system may not be able to process the events as fast as they are sent by the software running on the host computer.

Although the above embodiments concern controlling the real-time clock signal of an embedded system being designed, simulated, or verified by software running on a host workstation, other real-time events (e.g., asynchronous or nonperiodic events) can similarly be controlled by software running on the host computer. For example, there are a variety of other sources of real-time events that control the operation of the embedded system. For example, actuators, sensors, other embedded systems, and/or other peripherals coupled to the embedded system can generate real-time events (e.g., asynchronous interrupts or asynchronous external events) that affect how the embedded software is being executed according to the RTOS. For example, the RTOS might execute a high-priority task upon receiving an interrupt from a peripheral coupled to the embedded processor. Using embodiments of the disclosed technology, the sources of these real-time events can be modified so that they originate within software running on a host computer instead.

Figure 10:
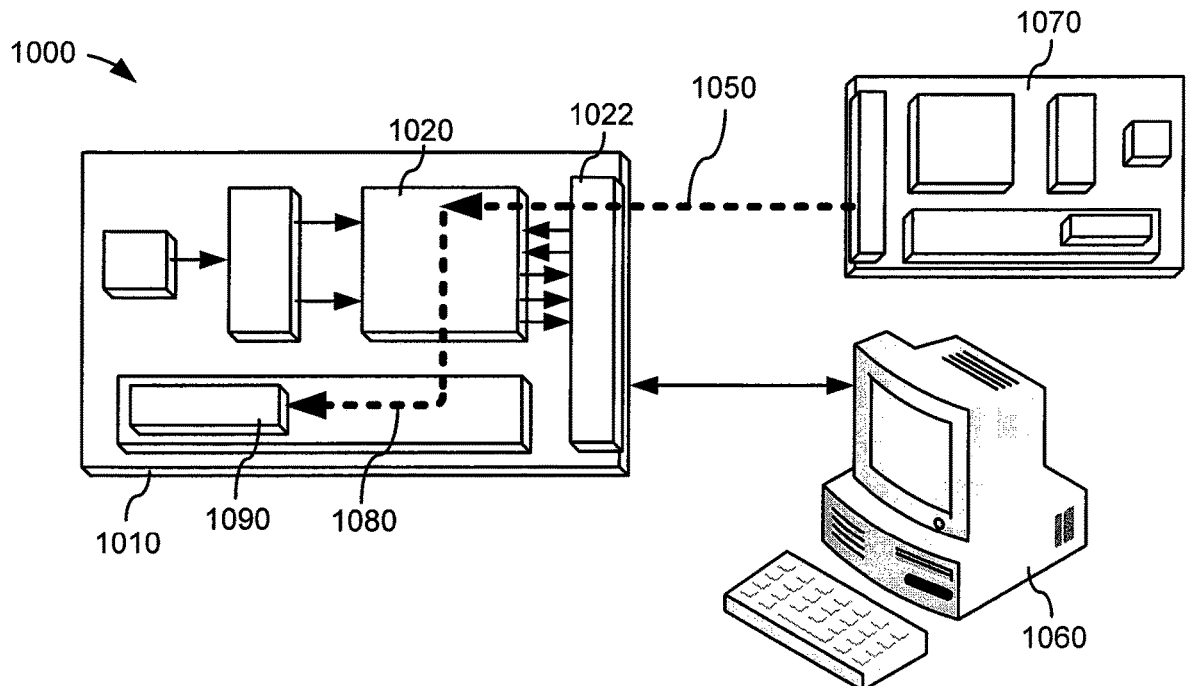
FIG. 10 is a schematic block diagram illustrating an exemplary design, simulation, or verification environment in which real-time events controlling operations in an embedded system are generated by external peripherals of the embedded system.

FIG. 10 is a schematic block diagram 1000 showing an exemplary design, simulation, or verification environment in which a workstation 1060 is coupled to an embedded system 1010 and in which a real-time event signal is provided by a peripheral coupled to a processor 1020 of the embedded system through an I/O mechanism 1022. In this example, the real-time event is generated by another embedded system 1070. This particular arrangement should not be construed as limiting, however, as the real-time event can be generated by a variety of sources. For instance, in a real-time system, an I/O peripheral (e.g., an A/D converter, pulse-width modulator, digital I/O, or other such peripheral) is often used to sample and send digital data to the processor where the embedded software application operates on the data and sends output signals to other subsystems. For purposes of illustration, the path of the real-time event from its original source in the other embedded system 1070 to the processor 1020 is shown as dashed line 1050 in FIG. 10. Similar to how the signal along path 650 in FIG. 6 is shown to trigger another signal along path 670, the signal along the path 1050 in FIG. 10 is shown to trigger, typically through the interrupt subsystem of the processor 1020, another signal along path 1080 that continues from the hardware and into the interrupt subsystem of the RTOS software 1090.

Figure 11:
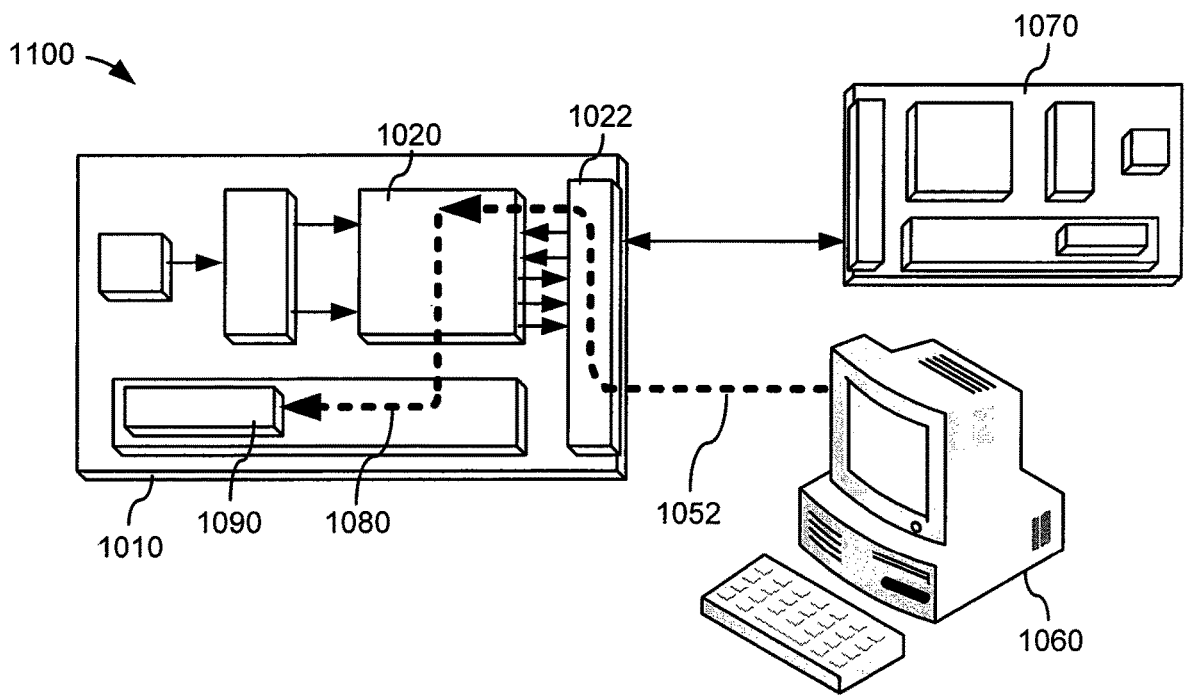
FIG. 11 is a schematic block diagram illustrating an exemplary design, simulation, or verification environment in which real-time events controlling operations in an embedded system are generated by software running on a host workstation.

FIG. 11 is a schematic block diagram 1100 showing the exemplary design, simulation, or verification environment of FIG. 10 after it has been modified so that the real-time event is generated by software running on the host computer 1060 instead of the other embedded system 1070. The real-time event in FIG. 11 can be generated by software running on the workstation 1060, such as a software debugger or simulation tool. The "simulated" real-time event can be coupled to the embedded system 1010 through one of the I/O mechanisms that provides a communication channel between the workstation 1060 and the processor 1020. The real-time event path is illustrated in FIG. 11 by dashed line 1052. The real-time event can be propagated through any suitable I/O mechanism 1022 of the embedded system 1010 capable of coupling the workstation 1060 to the interrupt subsystem of the processor 1020. For example, the real-time event can be routed on a LAN channel, USB channel, SPI channel, JTAG channel, FlexRay channel, LIN channel, CAN channel, IPC channel, or any combination or subcombination thereof. Similar to how the signal along path 1050 in FIG. 10 is shown to trigger another signal along path 1080, the signal along the path 1052 in FIG. 11 is shown to trigger, typically through the interrupt subsystem of the processor 1020, another signal along path 1080 that continues from the hardware and into the interrupt subsystem of the RTOS software 1090.

As discussed above with respect to FIG. 6, in order for the processor 1020 to properly receive the real-time clock signal along the communication channel coupled to the workstation, modifications to the RTOS and/or other embedded software are typically performed. The various techniques described above with respect to FIG. 7 can also be used to modify the RTOS and/or other embedded software so that processor 1020 will expect the real-time event through the desired I/O mechanism coupled to the workstation 1060.

Figure 12:
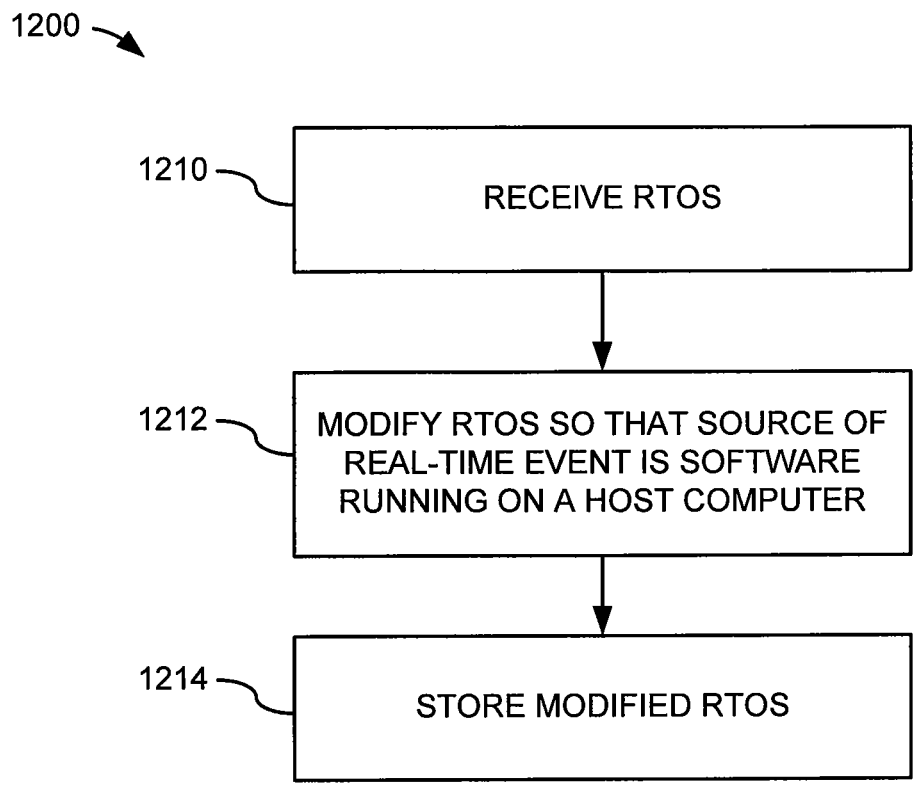
FIG. 12 is a flowchart illustrating an exemplary method for modifying an RTOS of an embedded system so that the source of real-time events is software running on a host workstation.

FIG. 12 is a flowchart illustrating one exemplary embodiment 1200 for modifying the RTOS to receive real-time events from software running on a host computer. At 1210, at least a portion of an RTOS for a processor of an embedded system is received (e.g., the portion of the RTOS handling I/O services or peripheral assignments). At 1212, the RTOS is modified so that the pathway on which a real-time event is received is a communication channel of the embedded system that is to be coupled to the host computer (e.g., a LAN channel, USB channel, SPI channel, JTAG channel, FlexRay channel, LIN channel, CAN channel, IPC channel, or any combination or subcombination thereof). Consequently, the source of the real-time event signal is decoupled from the source of the processor clock signal (the ultimate "time bases" or "time planes" of the signals are consequently decoupled and thus separately controllable). At 1214, the modified RTOS is stored (e.g., on one or more tangible computer-readable media of the host workstation or in memory of the embedded system for execution).

Figure 13:
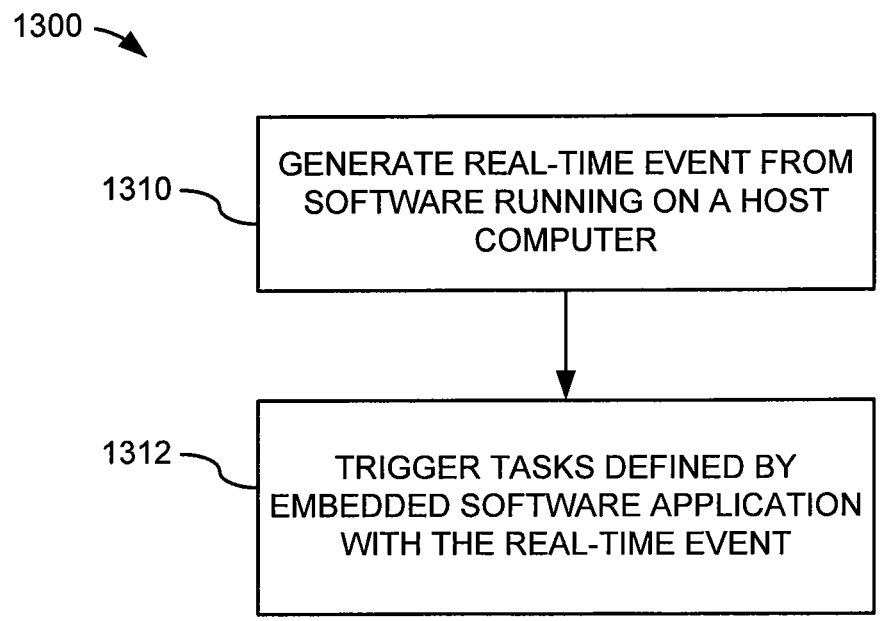
FIG. 13 is a flowchart illustrating an exemplary method of operating a design, simulation, or verification environment in which real-time events for controlling operations of an embedded system are generated by software running on a host workstation.

FIG. 13 is a flowchart illustrating an exemplary method 1300 for controlling real-time events in a design, simulation, or verification environment (e.g., in any of the design or simulation environments described above with respect to FIGS. 4 and 5). At 1310, a real-time event is generated by software running on the host computer. At 1312, one or more tasks defined by the software application being executed by the RTOS running on an embedded processor of an embedded system are triggered by the real-time event signal. The RTOS can be a modified RTOS configured to receive the real-time event signal through a communication channel coupled to the host computer. For example, the RTOS can be modified by the method 1200 of FIG. 12. Because the real-time event is independent of the processor clock and clock source of the embedded system, the software running on the host computer can control the embedded software of the embedded system in a time-synchronized fashion, at a different time base relative to the processor clock, without interrupting the processor clock. For instance, the processor clock may continue to operate at full speed during method acts 1310, 1312.

As with the real-time clock signal described above with respect to FIG. 9, the software running on the host computer can generate the real-time event in a blocking mode or non-blocking mode. When used with simulation models of sensors, actuators, and plants, blocking mode can provide the ability for an embedded software debugger or simulator running on the host computer to "stop time" (e.g., to stop real-time) on a running physical system. Such control is ordinarily not possible when the real-time event is generated continuously by a sensor or plant. For example, if the real-time event is provided by a sensor coupled to a spinning motor, it is not possible to stop the momentum of a spinning motor so that a software debugger can single-step through the controller code. By remapping the real-time event to be generated by software running on the host computer, however, greater flexibility and visibility in debugging the embedded software can be achieved.

The embodiments of FIGS. 11-13 and the accompanying discussion encompass real-time events that are dependent on the RTOS real-time clock and real-time events that are independent of the RTOS real-time clock. For example, in a real-time system, certain I/O peripherals may be periodically commanded through the real-time clock or another clock signal derived from or related to the real-time clock. These I/O peripherals can provide data to and/or receive data from the software application for processing. By using a combination of the techniques described above with respect to FIGS. 7-9 and FIGS. 11-13, the real-time event signals triggering the reading or writing of this data can be based instead on an event generated by software running on the host computer. For instance, the software running on the host computer can control all events related to the real-time clock or, in certain embodiments, all events in the real-time domain (or application time domain) as a whole. In other embodiments, the software running on the host computer can control any subset of real-time events, whether or not they are synchronous or asynchronous with the real-time clock.

In general, any of the above-described methods related to controlling a real-time clock can be used in conjunction with the methods related to controlling real-time events. For example, embodiments of the disclosed technology include methods, systems, and apparatus that modify RTOSes of one or more embedded systems so that both the real-time clocks and real-time events are controlled by software running on a host workstation.

Any of the above-described methods can be performed using physical embedded systems or simulated embedded systems or hybrids thereof where part of the system is simulated and the remaining parts are physical. For example, the embedded system or the embedded processor in FIG. 7-9 or 11-13 can be a physical embodiment of the system or processor (e.g., a physical prototype of the embedded system or embedded processor), a simulated embedded system (e.g., using a RTOS simulator), or a simulated embedded processor (e.g., using an instruction set simulator). In a simulated embedded system environment, the real-time clock source driving the RTOS time base can be decoupled from the host workstation's timer service and controlled independently (in a host workstation, the timer service typically has the same time base of the processor clock, and thus they are coupled to each other). Further, in the simulated environment, the embedded processor can be simulated by, for example, an instruction set simulator. The other hardware components of the system can either be simulated by any suitable hardware simulator or they can be actual physical hardware components.

Furthermore, although the exemplary embodiments described above with respect to FIGS. 6-13 are shown in connection with only a single embedded system being designed, simulated, or verified, the disclosed embodiments can be used in any of the design, simulation, or verification environments described above that involve multiple embedded systems. For example, the disclosed embodiments can be used in design, simulation, or verification environments having two or more embedded systems with real-time clock signals or real-time events that are desirably controlled by the software running on the host computer. For example, any collection of real or simulated embedded systems can be concurrently included in a design, simulation, or verification environment according to the disclosed technology.

Further, the real-time clock and/or peripheral I/O real-time events can come from a single software process running on a host computer or from two or more synchronized software processes running on one or more host computers.

Embodiments of the disclosed technology make it possible, for instance, to have a break point on a real-time event on one of the embedded systems and maintain real-time synchronization with the other embedded systems. The real-time events of these embodiments can be communicated to the targeted embedded systems using any available communication channel (e.g., any available channel normally used for debugging, such as a LAN, USB, or JTAG channel, or any other available channel, such as a CAN, LIN, IPC, or other such channel).

Furthermore, although the exemplary embodiments described above with respect to FIGS. 7-9 and FIGS. 11-13 depict the real-time clock and event signals emanating from software running on a host computer, it should be noted and understood that the source of the signals is arbitrary for certain embodiments as long as it is independent of the processor clock source (decoupled and having possibly different time bases). For example, the software that sources the time-decoupled real-time clock and event signals could execute as a separate task executing on the embedded processor and controlled (scheduled) by the RTOS. This is useful when the physical embedded system does not have suitable I/O mechanisms to communicate with the software running on the host computer or cannot do so in a timely manner.

Figure 14:
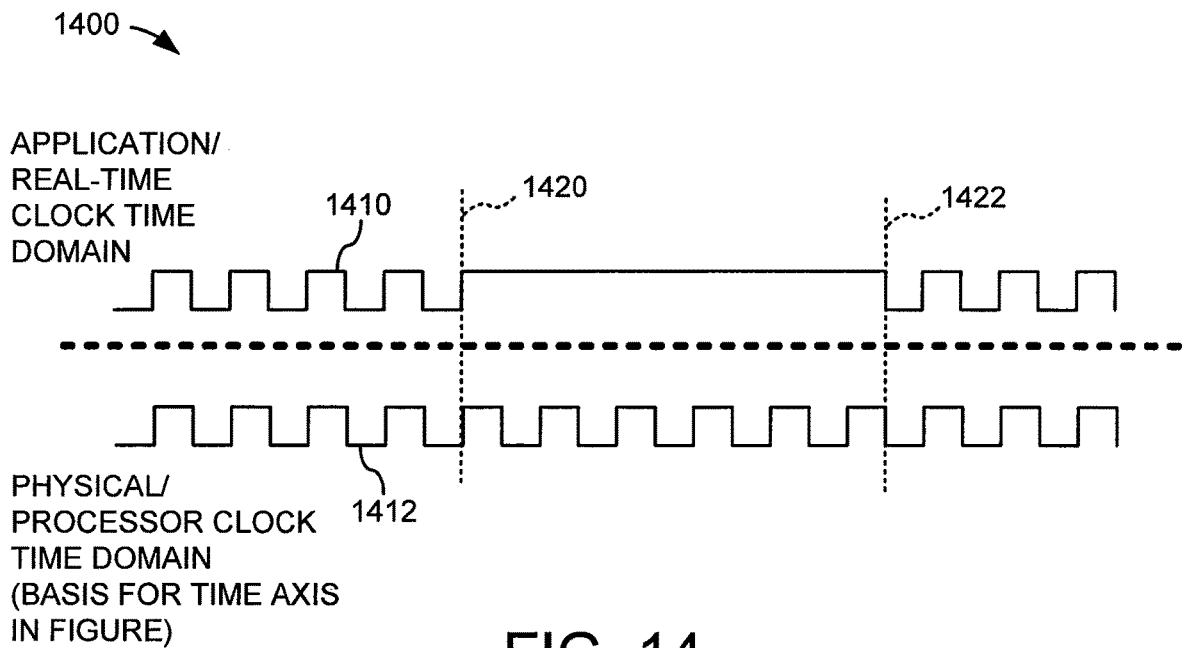
FIG. 14 is a timing diagram conceptually illustrating an independent real-time clock relative to a processor clock where the two clocks have a different time base.
Figure 15:
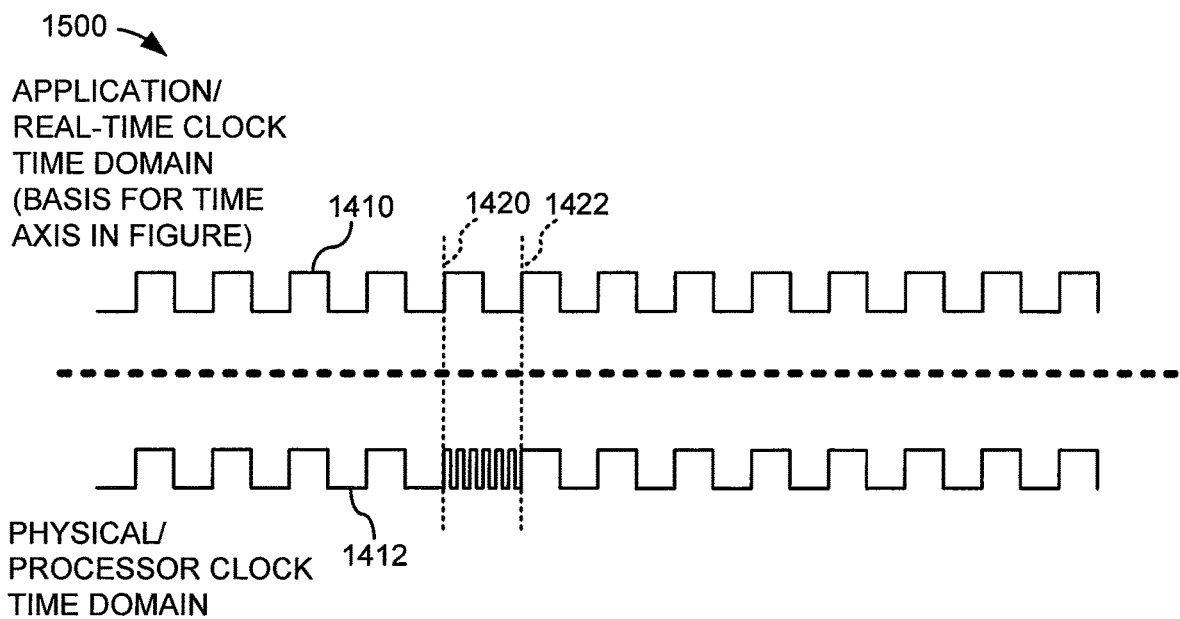
FIG. 15 is a timing diagram conceptually illustrating an independent real-time clock relative to a processor clock where the two clocks have a different time base.

FIGS. 14 and 15 are exemplary timing diagrams 1400 and 1500 that conceptually illustrate how time as perceived in the application time domain can be separated from time as perceived in the physical domain using embodiments of the disclosed technology (such as those described above with respect to FIGS. 7-9 and FIGS. 11-13). These figures illustrate situations where the real-time clock and the processor clock have separate time bases. In particular, FIG. 14 shows a timing diagram 1400 where the processor clock rate is used as the basis of the time axis. In timing diagram 1400, waveform 1412 illustrates the periodic pulses of the processor clock, and waveform 1410 illustrates a real-time clock. For purposes of illustration, waveforms 1410 and 1412 are shown as having the same frequency and as being synchronous with one another when both are operating together. In reality, however, the frequency differences between the two waveforms may be significant and the two waveforms may be asynchronous.

FIG. 14 shows that at time 1420, the real-time clock in the logic domain is suspended. This might be caused, for instance, by a software debugger running on a workstation suspending execution of the software being tested as part of the debugging process. Because the real-time clock is independent of the processor clock in the illustrated embodiment, FIG. 14 shows that the processor clock continues to operate without interruption. At time 1422, the real-time clock is reactivated and the waveform 1410 continues.

FIG. 15 is similar to timing diagram 1400 but uses the real-time clock as the basis of the time axis. Times 1420 and times 1422 are also shown in FIG. 15 but are shown using the real-time clock as the basis of the time axis. Consequently, that portion of waveform 1412 between the two times 1420 and 1422 is shown as occurring within a single real-time clock period. FIG. 15 illustrates that from the perspective of the application time domain, there is no interruption created when the real-time clock signal is temporarily suspended. For instance, the software executing on a processor of an embedded system is defined in terms of a series of logical steps that typically do not change depending on whether or not the real-time clock is suspended (and assuming that the other logical components of the system are controlled by the same real-time clock).

Furthermore, although the exemplary embodiments described above with respect to FIGS. 14-15 illustrate a simulation environment in which the application time domain is "slowed down" relative to its normal physical time domain counterpart, it should be understood that it is also possible to reverse this situation and the application time domain can be "sped up" relative to its normal physical time domain counterpart. This is useful when it is desirable to accelerate real-time in order to simulate and verify long term operations in a relatively short time.

Because several of the disclosed embodiments control the real-time clock signals and/or real-time events provided to an RTOS and application software running on an embedded processor, there would appear to be some risk that the separation of the source of the real-time clock or other real-time events from the source of the processor clock would make it more difficult to know whether the RTOS running on the embedded processor operates deterministically. However, because the sources of the real-time clock and/or real-time events are controlled, the actual interrupt service routine (ISR) execution times for the embedded systems can be measured with high accuracy. For example, the real-time events can be controlled so that they do not interrupt the ISRs, as could occur when the real-time events are tied to the processor clock. In one embodiment of the disclosed technology, the system profiler is used to accurately measure the execution times (e.g., even if the execution times run over the normal time allotments).

V. Exemplary Network Environments for Applying the Disclosed Techniques

Figure 16:
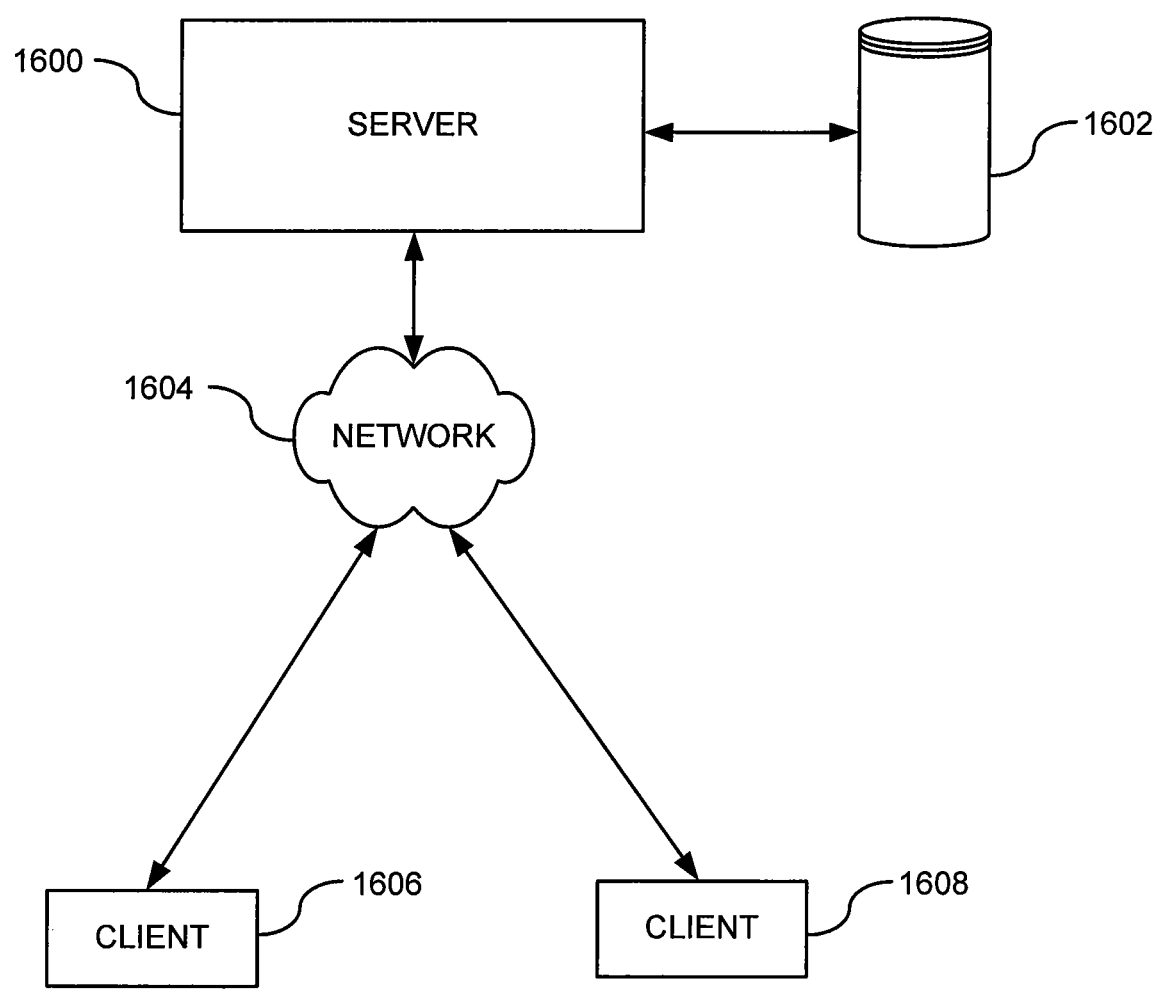
FIG. 16 is a schematic block diagram illustrating a first exemplary computer network in which aspects of the disclosed technology can be performed.

Any of the aspects of the technology described above may be performed using a distributed computer network. FIG. 16 shows one such exemplary network. A server computer 1600 can have an associated storage device 1602 (internal or external to the server computer). For example, the server computer 1600 can be configured to perform any of the disclosed embodiments (e.g., as part of an EDA software tool, such as an EDA tool for designing, simulating, or verifying embedded systems). The server computer 1600 can be coupled to a network, shown generally at 1604, which can comprise a wide-area network, a local-area network, a client-server network, the Internet, or other such network. One or more client computers, such as those shown at 1606, 1608, may be coupled to the network 1604 using a network protocol. The work may also be performed on a single, dedicated workstation, which has its own memory and one or more CPUs.

Figure 17:
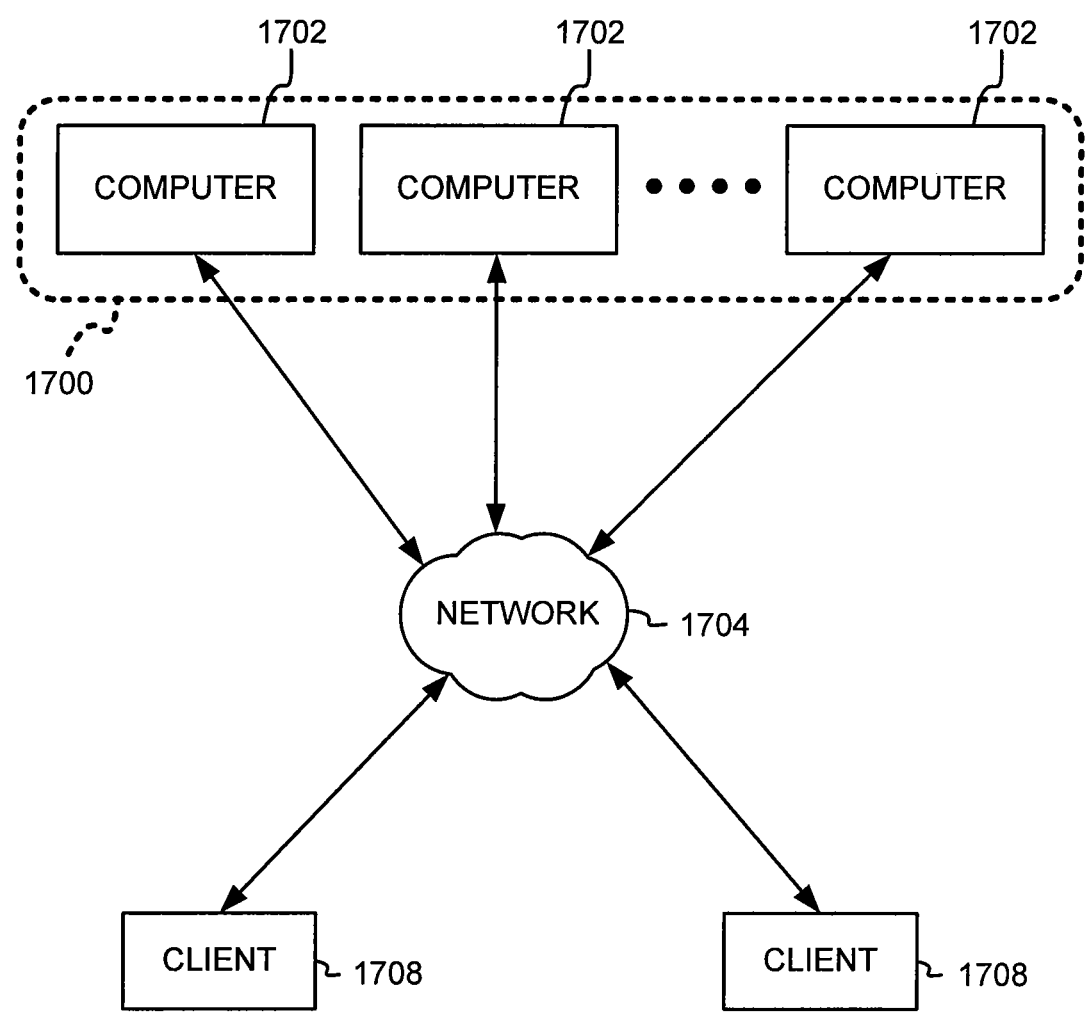
FIG. 17 is a schematic block diagram illustrating a second exemplary computer network in which aspects of the disclosed technology can be performed.

FIG. 17 shows another exemplary network. One or more computers 1702 communicate via a network 1704 and form a computing environment 1700 (e.g., a distributed computing environment). Each of the computers 1702 in the computing environment 1700 can be used to perform at least a portion of any of the disclosed embodiments. The network 1704 in the illustrated embodiment is also coupled to one or more client computers 1708.

Figure 18:
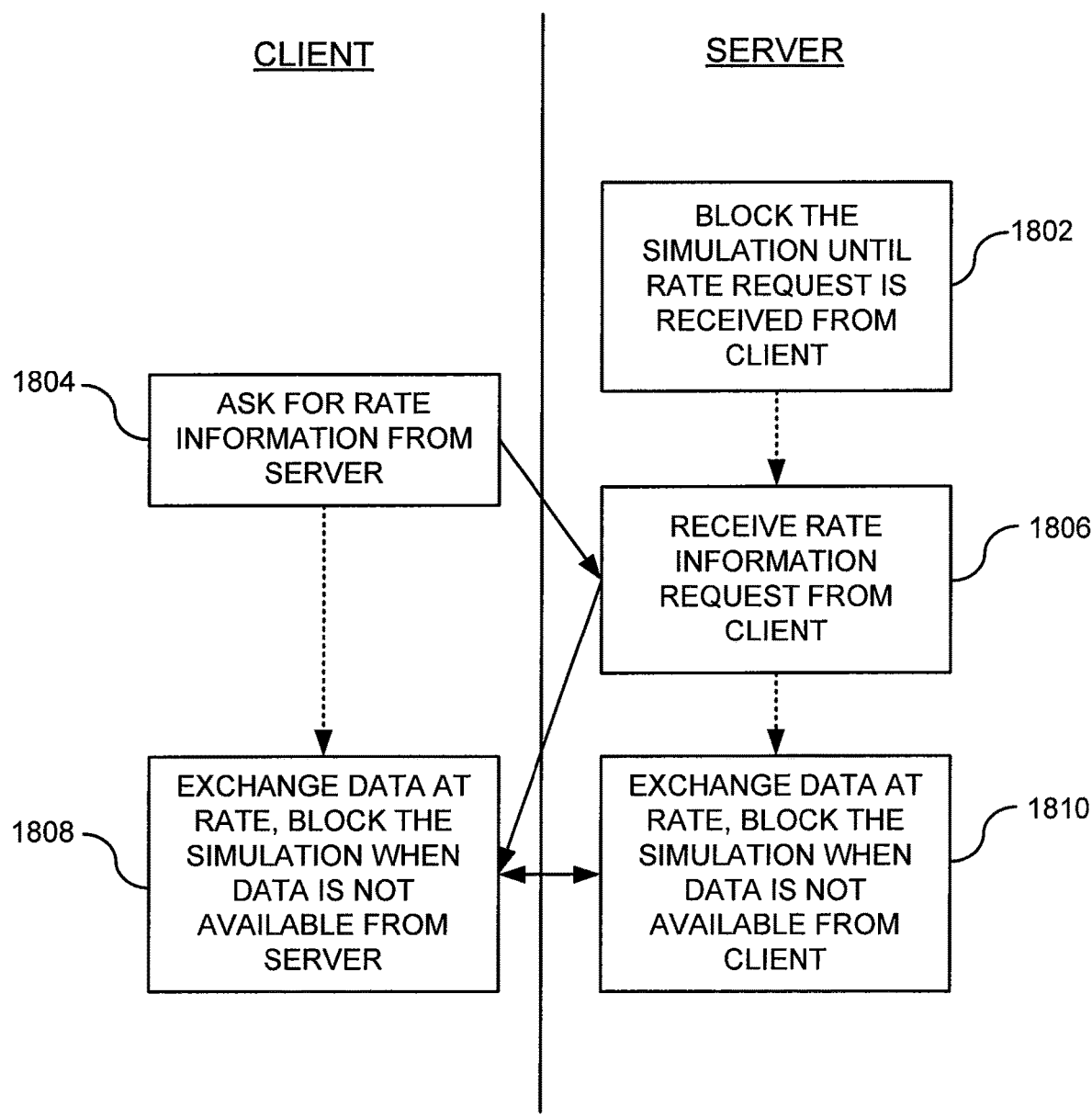
FIG. 18 is a flow chart illustrating one exemplary method for using embodiments of the disclosed technology in a distributed computing environment such as the computer networks of FIGS. 16 and 17.

FIG. 18 shows a method for using embodiments of the disclosed technology with a remote server computer (e.g., the server computer 1600 shown in FIG. 16) or with a remote computing environment (e.g., the computing environment 1700 shown in FIG. 17). If it were not possible to decouple the real-time clock from the processor clock using embodiments of the disclosed technology, the exemplary method shown in FIG. 18 would only be possible if the time latencies of model information exchange (the time it takes to exchange information) within a system simulation were less than the time between exchanges (which is typically not possible). Using embodiments of the disclosed technology, however, the time latencies of model information exchange are irrelevant because the simulations can wait (be blocked) for any amount of time that is necessary between exchanges without the possibility of real-time overrun. FIG. 18, for example, shows a system simulation where the system models are distributed across a networked computing environment and exchange simulation rate information at run-time in order to know when to block and wait for more data. At process block 1802, a model running on the server is blocked, waiting for a rate information request from a client. At process block 1804, the client makes a request for rate information. At process block 1806, the server receives the request and sends the rate data to the client. At process blocks 1808 and 1810, the client and server exchange simulation data at the communicated and agreed upon rate.

Having illustrated and described the principles of the disclosed technology, it will be apparent to those skilled in the art that the disclosed embodiments can be modified in arrangement and detail without departing from such principles. For example, although the disclosed embodiments are described as being applied during embedded system development, they are more generally applicable to any hardware and/or software development process in which it is desirable to control a clock or event that affects the operation of a hardware and/or software component and where that clock or event is normally derived from another source and/or otherwise shares the same time base (e.g., from an onboard clock of a PCB). In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. A method, comprising:
   generating a real-time clock signal; and
   triggering tasks defined by an embedded software application with the real-time clock signal,
   wherein the embedded software application is executed by an embedded processor with a real-time operating system ("RTOS"), and
   wherein the real-time clock signal is controllable independent of a processor clock signal driving the embedded processor such that the real-time clock signal has a different time base than the processor clock signal, and
   wherein the processor clock signal is derived from a source that is separate and different from a source of the real-time clock signal.

2. The method of claim 1, wherein the real-time clock signal is generated by software running on a computer workstation.

3. The method of claim 1, wherein the real-time clock signal is generated by software running on another external embedded system.

4. The method of claim 1, wherein the real-time clock signal is generated by software that is running as a task within the embedded processor.

5. The method of claim 1, further comprising suspending the generation of the real-time clock signal for a period of time without interrupting the processor clock signal.

6. The method of claim 5, wherein the act of suspending the generation of the real-time clock signal is performed in response to a signal controlled by the embedded software application being executed by the embedded processor.

7. The method of claim 5, further comprising restarting the generation of the real-time clock signal without interrupting the processor clock signal, the act of restarting the real-time clock causing the triggering to be continued.

8. The method of claim 7, wherein the act of restarting the generation of the real-time clock signal is performed in response to a signal controlled by the embedded software application being executed by the embedded processor.

9. The method of claim 1, wherein the embedded processor is part of an embedded system, and wherein the real-time clock signal is generated in part by a clock generator circuit located on the embedded system.

10. The method of claim 1, further comprising measuring execution times of software executed on the embedded processor using a system profiler.

11. A method, comprising:
    generating a series of real-time event signals; and
    triggering tasks defined by an embedded software application with the real-time event signals,
    wherein the embedded software application is executed by an embedded processor with a real-time operating system ("RTOS"), and
    wherein the real-time event signals are controllable independent of processor clock signals driving the embedded processor such that the real-time event signals have a different time base than the processor clock signals,
    wherein the processor clock signals are derived from a source that 1 s different and separate from the real-time event signals.

12. The method of claim 11, wherein the real-time event signals are generated by software running on a computer workstation.

13. The method of claim 11, wherein the real-time event signals are generated by software running on another external embedded system.

14. The method of claim 11, wherein the real-time event signals are generated by software that is running as a task within the embedded processor.

15. The method of claim 11, wherein the real-time event signals indicate that data is ready to be loaded from or sent to a peripheral coupled to the embedded processor.

16. The method of claim 11, further comprising suspending the generation of the series of real-time event signals for a period of time without interrupting the processor clock signals.

17. The method of claim 16, wherein the act of suspending the generation of the real-time event signals is performed in response to a signal controlled by the embedded software application being executed by the embedded processor.

18. The method of claim 16, further comprising restarting the generation of the series of real-time event signals without interrupting the processor clock signals, the act of restarting causing the triggering to be continued.

19. The method of claim 18, wherein the act of restarting the real-time event signals is performed in response to a signal controlled by the embedded software application being executed by the embedded processor.

20. The method of claim 11, wherein the embedded processor is part of an embedded system, and wherein the real-time event signals are generated by a circuit located on the embedded system.

21. The method of claim 11, further comprising measuring execution times of software executed on the embedded processor using a system profiler.

22. A system, comprising:
   a host computer configured to execute software that generates a first signal; and
   an embedded system coupled to the host computer and having an embedded processor, the embedded processor being configured to run a real-time operating system ("RTOS") that executes tasks of a software application based on receipt of the first signal from the software running on the host computer,
   the embedded processor being configured to execute individual instructions of the tasks based on receipt of a second signal, the first signal being controllable independent of the second signal such that the first and second signals have a different time base and such that the second signal is derived from a source that is different and separate from the first signal.

23. The system of claim 22, wherein the first signal is the real-time clock signal.

24. The system of claim 22, wherein the first signal is a real-time event signal that is not the real-time clock signal.

25. The system of claim 22, wherein the first signal is communicated through one of a local area network ("LAN") channel, universal serial bus ("USB") channel, serial peripheral interface ("SPI") channel, joint test action group ("JTAG") channel, FlexRay channel, local interconnect network ("LIN") channel, controller area network ("CAN") channel, or inter-process communication ("IPC") channel of the embedded system.

26. The system of claim 22, wherein the software executing on the host computer is capable of suspending the first signal while the second signal continues uninterrupted.

27. The system of claim 22, further comprising one or more additional embedded systems coupled to the host computer, each having respective embedded processors running respective RTOSes that are configured to execute tasks of respective software applications based on receipt of the first signal from software running on the host computer, and each being configured to execute individual instructions of the tasks based on receipt of other respective signals that are controllable independent of the first signal in a manner that allows the first signal and the other respective signals to have a different time base.

28. The system of claim 22, wherein the host computer is further configured to execute a simulator or debugger, and wherein the software that generates the first signal is running within the simulator or the debugger.

\* \* \* \* \*